United States Patent
Lee et al.

(10) Patent No.: US 12,132,071 B2
(45) Date of Patent: Oct. 29, 2024

(54) DISPLAY DEVICE

(71) Applicant: Samsung Display Co., LTD., Yongin-si (KR)

(72) Inventors: Jin Hyeong Lee, Suwon-si (KR); Dae Won Kim, Hwaseong-si (KR); Su Jeong Kim, Seoul (KR); Jong Ho Son, Seoul (KR); Ji Yoon Jung, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 414 days.

(21) Appl. No.: 17/690,366

(22) Filed: Mar. 9, 2022

(65) Prior Publication Data

US 2023/0023079 A1 Jan. 26, 2023

(30) Foreign Application Priority Data

Jul. 20, 2021 (KR) .......................... 10-2021-0094918

(51) Int. Cl.
| | |
|---|---|
| *H01L 27/15* | (2006.01) |
| *H01L 33/24* | (2010.01) |
| *H01L 33/38* | (2010.01) |
| *H01L 33/44* | (2010.01) |
| *H01L 33/50* | (2010.01) |
| *H01L 33/60* | (2010.01) |

(52) U.S. Cl.
CPC ............ *H01L 27/156* (2013.01); *H01L 33/24* (2013.01); *H01L 33/38* (2013.01); *H01L 33/44* (2013.01); *H01L 33/50* (2013.01); *H01L 33/60* (2013.01)

(58) Field of Classification Search
None
See application file for complete search history.

(56) References Cited

U.S. PATENT DOCUMENTS

2004/0245531 A1* 12/2004 Fuii .................... H01L 25/0753
257/88
2004/0263425 A1* 12/2004 Anzai ................. G09G 3/3208
345/1.1

(Continued)

FOREIGN PATENT DOCUMENTS

| CN | 111489658 | | 8/2020 | |
|---|---|---|---|---|
| CN | 113488498 | A * | 10/2021 | ......... H01L 25/0753 |
| WO | WO-2022050685 | A1 * | 3/2022 | ........... H01L 27/156 |

*Primary Examiner* — Scott B Geyer
(74) *Attorney, Agent, or Firm* — KILE PARK REED & HOUTTEMAN PLLC

(57) ABSTRACT

A display device includes a lower metal layer disposed on a surface of a substrate and including a first opening overlapping a rear emission pixel in a plan view; a first electrode and a second electrode disposed in each of the rear emission pixel and a front emission pixel, the first electrode and the second electrode being spaced apart from each other on the lower metal layer; first light emitting elements disposed between the first electrode and the second electrode disposed in the rear emission pixel; second light emitting elements disposed between the first electrode and the second electrode disposed in the front emission pixel; and a reflective layer disposed on the first light emitting elements and overlapping the rear emission pixel in a plan view, the reflective layer overlaps at least one of the first light emitting elements in a plan view.

20 Claims, 22 Drawing Sheets

(56) References Cited

U.S. PATENT DOCUMENTS

| | | | |
|---|---|---|---|
| 2014/0206117 A1* | 7/2014 | Sonoda | H05B 33/28 |
| | | | 438/29 |
| 2014/0209945 A1* | 7/2014 | Baldridge | H01L 27/153 |
| | | | 257/91 |
| 2017/0133818 A1 | 5/2017 | Cok | |
| 2017/0162746 A1* | 6/2017 | Cha | H01L 33/385 |
| 2018/0174519 A1* | 6/2018 | Kim | H01L 27/156 |
| 2019/0013377 A1 | 1/2019 | Nie | |
| 2020/0043976 A1* | 2/2020 | Kim | H01L 27/156 |
| 2020/0066787 A1* | 2/2020 | Park | H01L 27/156 |
| 2020/0144327 A1* | 5/2020 | Lee | H01L 27/156 |
| 2020/0279979 A1* | 9/2020 | Lee | H01L 25/0753 |
| 2021/0336088 A1* | 10/2021 | Park | H01L 33/62 |
| 2021/0359167 A1* | 11/2021 | Lee | H01L 27/156 |
| 2022/0037568 A1* | 2/2022 | Kwag | H01L 33/50 |
| 2022/0208849 A1* | 6/2022 | Lee | H01L 33/507 |
| 2022/0352433 A1* | 11/2022 | Cho | H01L 33/60 |
| 2022/0384683 A1* | 12/2022 | Lee | H01L 27/156 |

* cited by examiner

DISPLAY DEVICE

CROSS-REFERENCE TO RELATED APPLICATION(S)

This application claims priority to and benefits of Korean Patent Application No. 10-2021-0094918 under 35 U.S.C. § 119 filed on Jul. 20, 2021 in the Korean Intellectual Property Office, the entire contents of which are incorporated herein by reference.

BACKGROUND

1. Technical Field

The disclosure relates to a display device.

2. Description of the Related Art

The importance of display devices has steadily increased with the development of multimedia technology. In response thereto, various types of display devices such as an organic light emitting display (OLED), a liquid crystal display (LCD) and the like have been used.

A display device is a device for displaying an image, and may include a display panel, such as an organic light emitting display panel or a liquid crystal display panel. The light emitting display panel may include light emitting elements, for example, light emitting diodes (LED), and examples of the light emitting diode may include an organic light emitting diode (OLED) using an organic material as a light emitting material and an inorganic light emitting diode using an inorganic material as a light emitting material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a double-sided display device capable of driving both surfaces independently using a single display panel.

However, aspects of the disclosure are not restricted to the ones set forth herein. The above and other aspects of the disclosure will become more apparent to one of ordinary skill in the art to which the disclosure pertains by referencing the detailed description of the disclosure given below.

According to an embodiment, a display device may include a lower metal layer disposed on a surface of a substrate and including a first opening overlapping a rear emission pixel in a plan view; a first electrode and a second electrode disposed in each of the rear emission pixel and a front emission pixel, the first electrode and the second electrode being spaced apart from each other on the lower metal layer; first light emitting elements disposed between the first electrode and the second electrode disposed in the rear emission pixel; second light emitting elements disposed between the first electrode and the second electrode disposed in the front emission pixel; and a reflective layer disposed on the first light emitting elements and overlapping the rear emission pixel in a plan view, wherein the reflective layer overlaps at least one of the first light emitting elements in a plan view.

The first opening of the lower metal layer may overlap the first light emitting elements in a plan view.

The lower metal layer may overlap the second light emitting elements in a plan view.

The reflective layer may expose the second light emitting elements.

The display device may further include a buffer layer disposed on the lower metal layer; and a transistor disposed on the buffer layer, the transistor disposed in each of the rear emission pixel and the front emission pixel, wherein the transistor does not overlap the first opening of the lower metal layer in a plan view.

The transistor may not overlap the first light emitting elements in a plan view.

The display device may further include a first bank disposed along a boundary between the rear emission pixel and the front emission pixel, wherein the first bank may define an emission area and a non-emission area, the emission area may include a rear emission area of the rear emission pixel; and a front emission area of the front emission pixel, the first light emitting elements may be disposed in the rear emission area, and the second light emitting elements may be disposed in the front emission area.

The display device may further include a first wavelength conversion pattern disposed on the second light emitting elements and disposed in the front emission area.

The display device may further include a second wavelength conversion pattern disposed on the first light emitting elements and disposed in the rear emission area, wherein the first wavelength conversion pattern and the second wavelength conversion pattern may be disposed in a space partitioned by the first bank, and the reflective layer may be disposed on the second wavelength conversion pattern.

The display device may further include a light blocking member disposed in the non-emission area and the rear emission area, wherein the light blocking member may be disposed on the reflective layer, and the light blocking member may surround the first wavelength conversion pattern.

The display device may further include a low reflective layer disposed between the lower metal layer and the substrate, wherein the low reflective layer may include a second opening overlapping the first opening of the lower metal layer in a plan view.

According to an embodiment a display device may include a first substrate including a first emission area; a second emission area; and a non-emission area surrounding the first emission area and the second emission area; a lower metal layer disposed on a surface of the first substrate; a buffer layer disposed on the lower metal layer; a semiconductor layer disposed on the buffer layer, the semiconductor layer including an active pattern of a transistor; a gate insulating layer disposed on the semiconductor layer; a first conductive layer disposed on the gate insulating layer, the first conductive layer including a gate electrode of the transistor; an interlayer insulating layer disposed on the first conductive layer; a second conductive layer disposed on the interlayer insulating layer, the second conductive layer including a source electrode and a drain electrode of the transistor; a via layer disposed on the second conductive layer; a first electrode and a second electrode disposed in each of the first emission area and the second emission area, the first electrode and the second electrode being spaced apart from each other on the via layer; a light emitting element disposed between the first electrode and the second electrode of each of the first emission area and the second emission area; and a reflective layer overlapping the first emission area in a plan view, wherein the lower metal layer may include an opening overlapping the first emission area in a plan view, and the opening of the lower metal layer may not overlap the first conductive layer, the second conductive layer, and the semiconductor layer in a plan view.

The reflective layer may completely overlap a first light emitting element disposed in the first emission area in a plan view.

The opening of the lower metal layer may overlap the first light emitting element disposed in the first emission area in a plan view.

The reflective layer may not overlap the second emission area and the non-emission area in a plan view.

According to an embodiment, a display device may include a first display substrate including a first substrate; a circuit element layer disposed on a surface of the first substrate; and a light emitting element layer disposed on a surface of the circuit element layer; and a second display substrate including a second substrate facing another surface of the first substrate, and a lower wavelength control layer disposed on a surface of the second substrate facing the first substrate, wherein the circuit element layer may include a lower metal layer including a first opening overlapping a rear emission area in a plan view, and wherein the light emitting element layer may include a first electrode and a second electrode disposed in each of the rear emission area and a front emission area, the first electrode and the second electrode being spaced apart from each other on the lower metal layer; first light emitting elements disposed between the first electrode and the second electrode in the rear emission area; second light emitting elements disposed between the first electrode and the second electrode in the front emission area; and a reflective layer disposed on the first light emitting elements and overlapping the rear emission area in a plan view, wherein the reflective layer may overlap at least one of the first light emitting elements in a plan view.

The first display substrate may include an upper wavelength control layer and an upper light blocking member disposed on a surface of the light emitting element layer, and the second display substrate may include a lower light blocking member disposed on a surface of the second substrate.

The upper light blocking member may overlap the rear emission area and a non-emission area surrounding the rear emission area and the front emission area in a plan view, the lower light blocking member overlaps the front emission area and the non-emission area in a plan view, the upper wavelength control layer may overlap the front emission area in a plan view, and the lower wavelength control layer may overlap the rear emission area in a plan view.

The opening of the lower metal layer may overlap the first light emitting elements in a plan view.

The reflective layer may expose the second light emitting elements.

The display device according to an embodiment may provide a double-sided display device including a rear emission pixel and a front emission pixel, thereby displaying images on both surfaces. The rear emission pixel and the front emission pixel may be driven separately for an independent display.

However, the effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
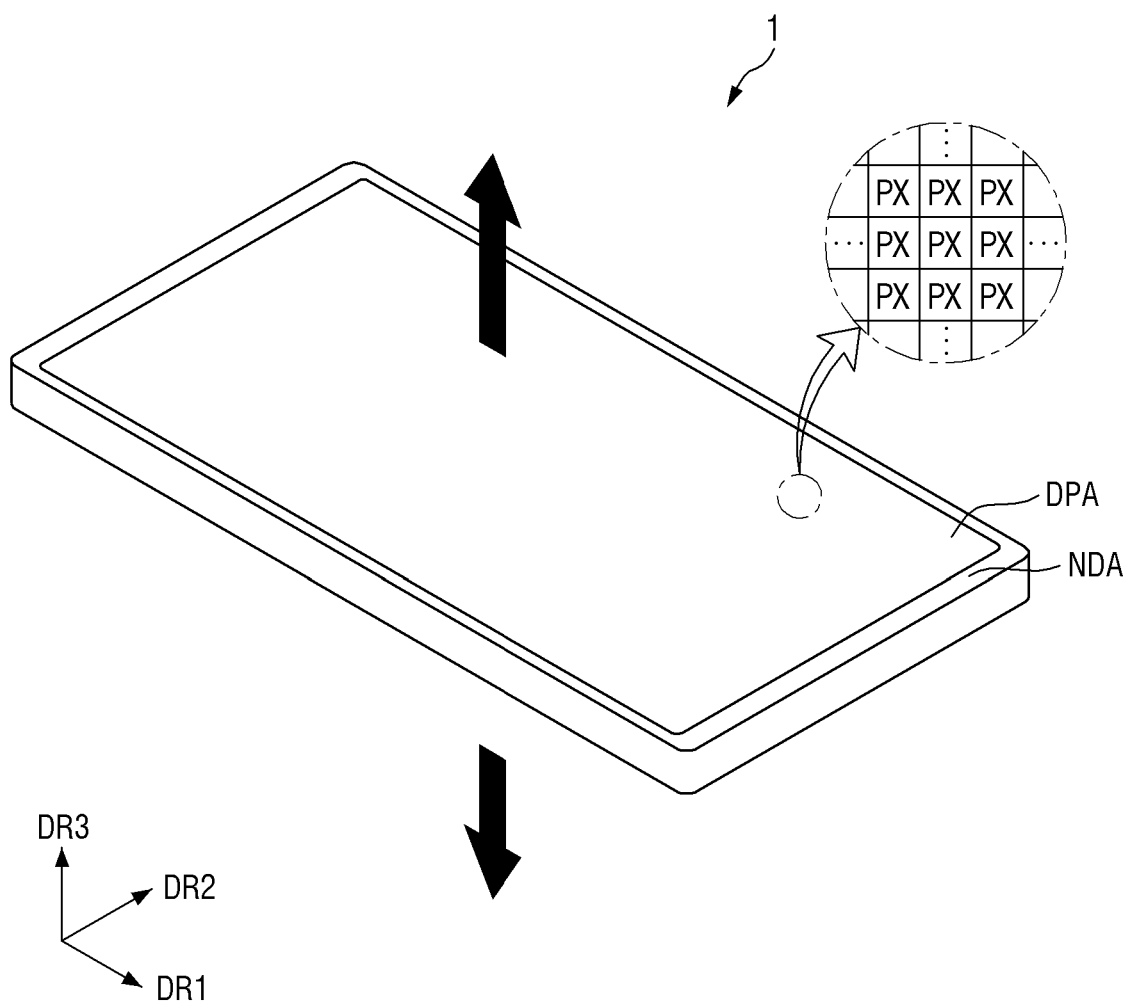
FIG. 1 is a schematic perspective view of a display device according to one embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

It will also be understood that when a layer is referred to as being "on" another layer or substrate, it can be directly on the other layer or substrate, or intervening layers may also be present. The same reference numbers indicate the same components throughout the specification.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings.

FIG. 1 is a schematic perspective view of a display device according to one embodiment.

Referring to FIG. 1, a display device 1 displays a moving image or a still image. The display device 1 may refer to any electronic device providing a display screen. Examples of the display device 1 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 1 may include a display panel which provides a display screen. Examples of the display panel may include an inorganic light emitting diode display panel, an organic light emitting display panel, a quantum dot light emitting display panel, a plasma display panel and a field emission display panel. In the following description, a case where an inorganic light emitting diode display panel is applied as a display panel will be described, but the disclosure is not limited thereto, and other display panels may be applied within the same spirit and scope of the disclosure.

Hereinafter, a first direction DR1, a second direction DR2, and a third direction DR3 are defined in drawings of an embodiment describing the display device 1. The first direction DR1 and the second direction DR2 may be directions perpendicular to each other in a plane. The third direction DR3 may be a direction perpendicular to a plane on which the first direction DR1 and the second direction DR2 may be located or disposed. The third direction DR3 is perpendicular to each of the first direction DR1 and the second direction DR2. In the embodiment describing the display device 1, the third direction DR3 indicates a thickness direction of the display device 1.

The display device 1 may have a rectangular shape including long and short sides such that the side in the first direction DR1 is longer than the side in the second direction DR2 in a plan view. A corner portion where the long side and the short side of the display device 1 meet may have a right angle in a plan view. However, the disclosure is not limited thereto, and the corner portion may be rounded to have a curved shape. The shape of the display device 1 is not limited to the illustrated one and may be variously modified. For example, the display device 1 may have other shapes such as a square shape, a quadrilateral shape with rounded corners (vertices), other polygonal shapes and a circular shape in a plan view. It is to be understood that the shapes disclosed herein may include shapes substantially identical or similar to the shapes.

The display device 1 may include a first surface and a second surface opposite to each other in the third direction DR3 that is the thickness direction. The display device 1 according to one embodiment may display images on each of the first surface (one surface or a surface, a front surface, or a top surface) and the second surface (the other surface or another surface, a rear surface, or a bottom surface). For example, the display device 1 may be a double-sided display device 1 that displays images on both surfaces of the display device 1.

Hereinafter, in embodiments describing the display device 1, unless otherwise noted, the term "upward" refers to one side or a side of the third direction DR3, and the term "top surface" refers to a surface toward the one side or a side of the third direction DR3. Further, the term "downward" refers to the other side or another side of the third direction DR3, and the term "bottom surface" refers to a surface toward the other side or another side of the third direction DR3. Furthermore, "left", "right", "upper" and "lower" indicate directions in case that the display device 1 is viewed from above. For example, "right side" indicates one side or a side of the first direction DR1, "left side" indicates the other side of the first direction DR1, "upper side" indicates one side or a side of the second direction DR2, and "lower side" indicates the other side of the second direction DR2.

The display device 1 may include a display area DPA and a non-display area NDA. The display area DPA is an area where a screen can be displayed, and the non-display area NDA is an area where a screen is not displayed.

The shape of the display area DPA may follow the shape of the display device 1. For example, the shape of the display area DPA may have a rectangular shape similar to the overall shape of the display device 1 in a plan view. The display area DPA may substantially occupy the center of the display device 1.

The display area DPA may include pixels PX. The pixels PX may be arranged or disposed in a matrix. The shape of each pixel PX may be a rectangular or square shape in a plan view. In an embodiment, each pixel PX may include light emitting elements made of inorganic particles.

The non-display area NDA may be disposed around the display area DPA. The non-display area NDA may completely or partially surround or may be adjacent to the display area DPA. The non-display area NDA may form a bezel of the display device 1.

Figure 2:
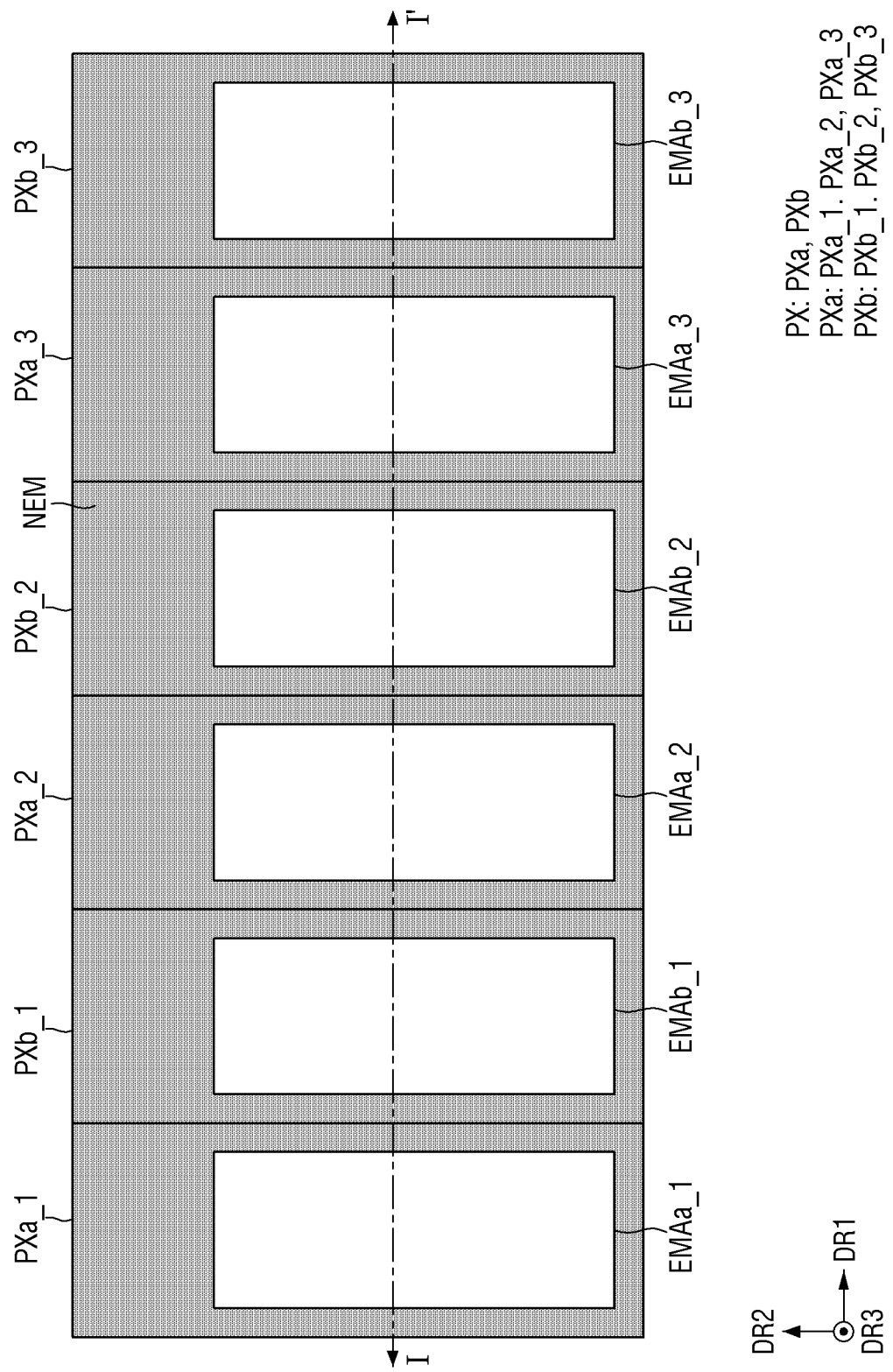
FIG. 2 is a schematic plan view showing a pixel arrangement of a display device according to one embodiment.

FIG. 2 is a schematic plan view showing a pixel arrangement of a display device according to one embodiment.

Referring to FIG. 2, the pixel PX of the display device 1 according to one embodiment may include a rear emission pixel PXa and a front emission pixel PXb.

The rear emission pixel PXa may be a pixel PX that displays an image on the rear surface (bottom surface) of the display device 1, and the front emission pixel PXb may be a pixel PX that displays an image on the front surface (top surface) of the display device 1. The rear emission pixel PXa may mean a minimum unit repeated for a display on the rear surface of the display device 1, and the front emission pixel PXb may mean a minimum unit repeated for a display on the front surface of the display device 1.

For a full color display, each of the rear emission pixel PXa and the front emission pixel PXb may include pixels that emit different colors.

For example, the rear emission pixel PXa may include a first rear emission pixel PXa_1 for emitting light of a first color, a second rear emission pixel PXa_2 for emitting light of a second color, and a third rear emission pixel PXa_3 for emitting light of a third color. For example, the first color may be red, the second color may be green, and the third color may be blue. Although the drawing illustrates that the rear emission pixel PXa may include the first to third rear emission pixels PXa_1, PXa_2, and PXa_3, the disclosure is not limited thereto. For example, one rear emission pixel PXa may include more rear emission pixels.

Similarly, the front emission pixel PXb may include front emission sub-pixels. For example, the front emission pixel PXb may include a first front emission pixel PXb_1 for emitting light of the first color, a second front emission pixel PXb_2 for emitting light of the second color, and a third front emission pixel PXb_3 for emitting light of the third color. For example, the first color may be red, the second color may be green, and the third color may be blue. Although the drawing illustrates that one front emission pixel PXb may include three front emission sub-pixels, the disclosure is not limited thereto. For example, one front emission pixel PXb may include more front emission pixels.

The first to third rear emission pixels PXa_1, PXa_2, and PXa_3 and the first to third front emission pixels PXb_1, PXb_2, and PXb_3 may be alternately disposed in the first direction DR1. For example, the first rear emission pixel PXa_1 and the first front emission pixel PXb_1 for emitting light of the first color, the second rear emission pixel PXa_2 and the second front emission pixel PXb_2 for emitting light of the second color, and the third rear emission pixel PXa_3 and the third front emission pixel PXb_3 for emitting light of the third color may be sequentially disposed in the first direction DR1.

Each of the first to third rear emission pixels PXa_1, PXa_2, and PXa_3 and the first to third front emission pixels PXb_1, PXb_2, and PXb_3 may include an emission area EMA and a non-emission area NEM in the periphery thereof. For example, the first rear emission pixel PXa_1, the second rear emission pixel PXa_2, and the third rear emission pixel PXa_3 may include a first rear emission area EMAa_1, a second rear emission area EMAa_2, and a third rear emission area EMAa_3, respectively. The first front emission pixel PXb_1, the second front emission pixel PXb_2, and the third front emission pixel PXb_3 may include a first front emission area EMAb_1, a second front emission area EMAb_2, and a third front emission area EMAb_3, respectively.

The first to third rear emission areas EMAa_1, EMAa_2, and EMAa_3 may be respectively included in the first to third rear emission pixels PXa_1, PXa_2, and PXa_3, and may include a region, in which a light emitting element ED (see FIG. 3) is disposed, and a region adjacent thereto. The first to third front emission areas EMAb_1, EMAb_2, and EMAb_3 may be respectively included in the first to third front emission pixels PXb_1, PXb_2, and PXb_3, and may include a region, in which the light emitting element ED (see FIG. 3) is disposed, and a region adjacent thereto. Each of the first to third rear emission areas EMAa_1, EMAa_2, and EMAa_3 and the first to third front emission areas EMAb_1, EMAb_2, and EMAb_3 may include a region in which light emitting elements ED are disposed, and may further include a region through which light emitted from the light emitting elements ED is emitted upward or downward after being reflected or refracted by another member.

The non-emission area NEM may be disposed to surround the first to third rear emission areas EMAa_1, EMAa_2, and EMAa_3 and the first to third front emission areas EMAb_1, EMAb_2, and EMAb_3. The first to third rear emission areas EMAa_1, EMAa_2, and EMAa_3 and the first to third front emission areas EMAb_1, EMAb_2, and EMAb_3 may be divided by the non-emission area NEM.

Figure 3:
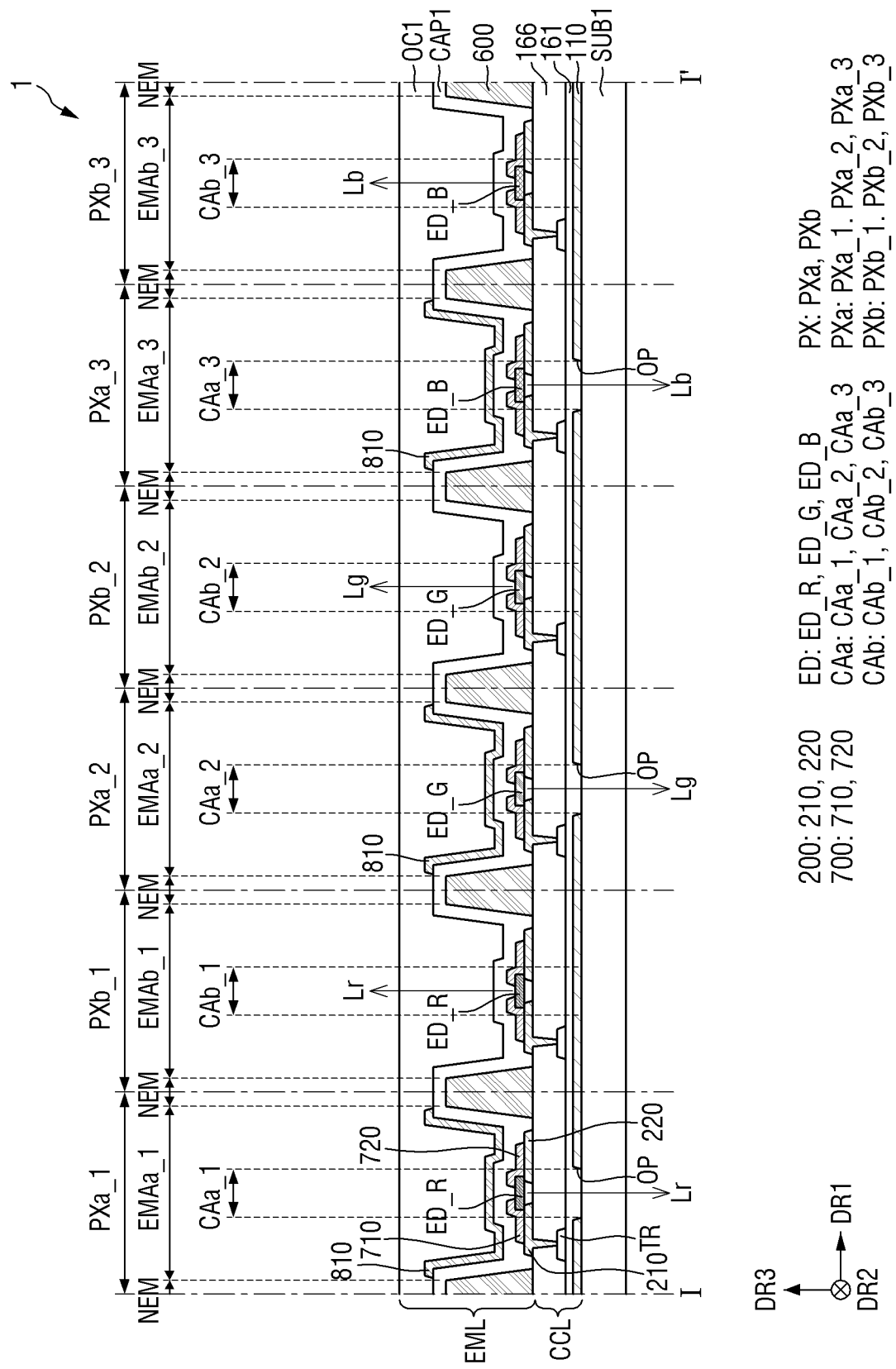
FIG. 3 is a schematic cross-sectional view illustrating an example taken along line I-I' of FIG. 2.

FIG. 3 is a schematic cross-sectional view illustrating an example taken along line I-I' of FIG. 2.

Referring to FIG. 3, the display device 1 according to one embodiment may include a first substrate SUB1, a circuit element layer CCL, and a light emitting element layer EML.

The first substrate SUB1 may be a base substrate or a base member, and may be made of an insulating material such as a polymer resin. The first substrate SUB1 may be made of an insulating material such as glass, quartz, or polymer resin. The first substrate SUB1 may be a rigid substrate, or a flexible substrate including plastic such as polyimide (PI) capable of bending, folding, or rolling.

The circuit element layer CCL may be disposed on the first substrate SUB1. The circuit element layer CCL may be disposed on one surface or a surface of the first substrate SUB1 to drive pixels PX. Since the circuit element layer CCL may include at least one transistor TR and the like for each of the rear emission pixel PXa and the front emission pixel PXb, the circuit element layer CCL may drive the rear emission pixel PXa and the front emission pixel PXb independently. Accordingly, the display device 1 may perform rear emission and front emission independently, and perform double-sided emission simultaneously without interference.

The circuit element layer CCL may include a lower metal layer 110, a buffer layer 161, at least one transistor TR, and a via layer 166.

The lower metal layer 110 may be disposed on one surface or a surface of the first substrate SUB1. The lower metal layer 110 may include openings OP. The openings OP may be disposed to correspond to the first to third rear emission areas EMAa_1, EMAa_2, and EMAa_3, respectively. The openings OP may overlap the first to third rear emission areas EMAa_1, EMAa_2, and EMAa_3, respectively, in the third direction DR3.

The buffer layer 161 may be disposed on the lower metal layer 110. The buffer layer 161 may be disposed to entirely cover or overlap the first substrate SUB1 on which the lower metal layer 110 is disposed. The buffer layer 161 may serve to protect the transistor TR from moisture permeating through the first substrate SUB1 that is susceptible to moisture permeation. The buffer layer 161 may be formed of inorganic layers that may be alternately stacked each other. For example, the buffer layer 161 may be formed of a multilayer in which inorganic layers including at least one of silicon oxide ($SiO_x$), silicon nitride ($SiN_x$) or silicon oxynitride ($SiO_xN_y$) may be alternately stacked each other.

The transistor TR may be disposed on the buffer layer 161. The transistor TR may be disposed in each of the first to third rear emission pixels PXa_1, PXa_2, and PXa_3 and the first to third front emission pixels PXb_1, PXb_2, and PXb_3. In one embodiment, the transistor TR included in each of the first to third rear emission pixels PXa_1, PXa_2 and PXa_3 and/or the transistor TR included in each of the first to third front emission pixels PXb_1, PXb_2 and PXb_3 may not overlap the opening OP of the lower metal layer 110 in the third direction DR3.

The via layer 166 may be disposed on the transistor TR. The via layer 166 may be a planarization layer. The via layer 166 may include an organic insulating material, for example, an organic material such as polyimide (PI).

The light emitting element layer EML may be disposed on the circuit element layer CCL. The light emitting element layer EML may be disposed on one surface or a surface of the via layer 166.

The light emitting element layer EML may include an electrode layer 200, the light emitting element ED, a contact electrode 700, a first bank 600, a first capping layer CAP1, a reflective layer 810, and a first planarization layer OC1.

The electrode layer 200 may be disposed on the via layer 166. The electrode layer 200 may include a first electrode 210 and a second electrode 220 spaced apart from each other. The first electrode 210 and the second electrode 220 may be disposed in each of the first to third rear emission pixels PXa_1, PXa_2, and PXa_3 and the first to third front emission pixels PXb_1, PXb_2, and PXb_3. The first electrode 210 may be electrically connected to the transistor TR through a contact hole penetrating the via layer 166.

The first bank 600 may be disposed on the via layer 166. The first bank 600 may be disposed in the non-emission area NEM along the boundary between the first to third rear emission pixels PXa_1, PXa_2, and PXa_3 and the first to third front emission pixels PXb_1, PXb_2, and PXb_3. The first bank 600 may have a shape protruding upward from the via layer 166. The first bank 600 may include openings that expose the light emitting elements ED. The first bank 600 may serve as a partition wall that prevents inks, in which light emitting elements ED are dispersed, from being mixed between the adjacent pixels PX, and allows the inks to be sprayed into the rear emission area EMAa or the front emission area EMAb in an inkjet printing step for aligning the light emitting elements ED during the manufacturing process of the display device 1.

The light emitting element ED may be disposed on the electrode layer 200. The light emitting element ED may be disposed in each of the first to third rear emission areas EMAa_1, EMAa_2, and EMAa_3 and the first to third front emission areas EMAb_1, EMAb_2, and EMAb_3. The light emitting element ED may be disposed between the first electrode 210 and the second electrode 220 in each of the first to third rear emission areas EMAa_1, EMAa_2, and EMAa_3 and the first to third front emission areas EMAb_1, EMAb_2, and EMAb_3. The light emitting element ED may be disposed such that both ends thereof are placed on the first electrode 210 and the second electrode 220, respectively.

The light emitting element ED may include a first type light emitting element ED_R for emitting light of the first color, a second type light emitting element ED_G for emitting light of the second color, and a third type light emitting element ED_B for emitting light of the third color. As described above, the first color may be red, the second color may be green, and the third color may be blue. In an embodiment, the first type light emitting element ED_R may emit the first color light or the red light having a peak wavelength in the range of about 580 nm to about 780 nm. The second type light emitting element ED_G may emit the second color light or the green light having a peak wavelength in the range of about 480 nm to about 580 nm. The third type light emitting element ED_B may emit the third color light or the blue light having a peak wavelength in the range of about 480 nm or less, and a peak wavelength in the range of about 445 nm to about 480 nm.

The first rear emission pixel PXa_1 and the first front emission pixel PXb_1 for emitting light of the first color may include the first type light emitting element ED_R. For example, the first type light emitting element ED_R may be disposed in the first rear emission area EMAa_1 of the first rear emission pixel PXa_1, and the first type light emitting element ED_R may be disposed in the first front emission area EMAb_1 of the first front emission pixel PXb_1.

The first type light emitting element ED_R, which emits light of the first color, is disposed in each of the first rear emission pixel PXa_1 and the first front emission pixel PXb_1 for emitting light of the first color, so that the first rear emission pixel PXa_1 and the first front emission pixel PXb_1 may emit light of the first color even in case that a wavelength conversion layer and/or a color filter layer is omitted. In one embodiment, light Lr of the first color, which is emitted from the first type light emitting element ED_R included in the first rear emission pixel PXa_1 and travels toward the opening OP of the lower metal layer 110, may be emitted to the outside through the bottom surface of the display device 1. Further, light Lr of the first color, which is emitted from the first type light emitting element ED_R included in the first front emission pixel PXb_1 and travels upward, may be emitted to the outside through the top surface of the display device 1.

The second rear emission pixel PXa_2 and the second front emission pixel PXb_2 for emitting light of the second color may include the second type light emitting element ED_G. For example, the second type light emitting element ED_G may be disposed in the second rear emission area EMAa_2 of the second rear emission pixel PXa_2, and the second type light emitting element ED_G may be disposed in the second front emission area EMAb_2 of the second front emission pixel PXb_2.

The second type light emitting element ED_G, which emits light of the second color, is disposed in each of the second rear emission pixel PXa_2 and the second front emission pixel PXb_2 for emitting light of the second color, so that the second rear emission pixel PXa_2 and the second front emission pixel PXb_2 may emit light of the second color even in case that a wavelength conversion layer and/or a color filter layer is omitted. In one embodiment, light Lg of the second color, which is emitted from the second type light emitting element ED_G included in the second rear emission pixel PXa_2 and travels toward the opening OP of the lower metal layer 110, may be emitted to the outside through the bottom surface of the display device 1. Further, light Lg of the second color, which is emitted from the second type light emitting element ED_G included in the second front emission pixel PXb_2 and travels upward, may be emitted to the outside through the top surface of the display device 1.

The third rear emission pixel PXa_3 and the third front emission pixel PXb_3 for emitting light of the third color may include the third type light emitting element ED_B. For example, the third type light emitting element ED_B may be disposed in the third rear emission area EMAa_3 of the third rear emission pixel PXa_3, and the third type light emitting element ED_B may be disposed in the third front emission area EMAb_3 of the third front emission pixel PXb_3.

The third type light emitting element ED_B, which emits light of the third color, is disposed in each of the third rear emission pixel PXa_3 and the third front emission pixel PXb_3 for emitting light of the third color, so that the third rear emission pixel PXa_3 and the third front emission pixel PXb_3 may emit light of the third color even in case that a wavelength conversion layer and/or a color filter layer is omitted. In one embodiment, light Lb of the third color, which is emitted from the third type light emitting element ED_B included in the third rear emission pixel PXa_3 and travels toward the opening OP of the lower metal layer 110, may be emitted to the outside through the bottom surface of the display device 1. Further, light Lb of the third color, which is emitted from the third type light emitting element ED_B included in the third front emission pixel PXb_3 and travels upward, may be emitted to the outside through the top surface of the display device 1.

The contact electrode 700 may be disposed on the electrode layer 200 and the light emitting element ED. The contact electrode 700 may include a first contact electrode 710 and a second contact electrode 720 spaced apart from each other. The first contact electrode 710 and the second contact electrode 720 may be disposed in each of the first to third rear emission pixels PXa_1, PXa_2 and PXa_3 and the first to third front emission pixels PXb_1, PXb_2 and PXb_3.

The first contact electrode 710 may be disposed on the first electrode 210 to be in contact with one end or an end of the light emitting element ED and a part of the first electrode 210. The first contact electrode 710 may electrically connect the first electrode 210 to one end or an end of the light emitting element ED.

The second contact electrode 720 may be disposed on the second electrode 220 to be in contact with the other end of the light emitting element ED and a part of the second electrode 220. The second contact electrode 720 may electrically connect the second electrode 220 to the other end of the light emitting element ED.

The first capping layer CAP1 may be disposed on the contact electrode 700. The first capping layer CAP1 may be disposed to entirely cover or overlap the first substrate SUB1. The first capping layer CAP1 may completely cover or overlap the electrode layer 200, the light emitting element ED, the contact electrode 700, and the first bank 600 disposed thereunder. The first capping layer CAP1 may include an inorganic insulating material or an organic insulating material. The first capping layer CAP1 may serve to protect a member disposed under or below the first capping layer CAP1 from foreign substances such as dust particles, or moisture or oxygen.

The reflective layer 810 may be disposed on the first capping layer CAP1. The reflective layer 810 may be disposed in each of the first to third rear emission areas EMAa_1, EMAa_2 and EMAa_3, but may not be disposed in the first to third front emission areas EMAb_1, EMAb_2, and EMAb_3 and the non-emission area NEM. For example, the reflective layer 810 may overlap the first to third rear emission areas EMAa_1, EMAa_2, and EMAa_3, but may not overlap the first to third front emission areas EMAb_1, EMAb_2, and EMAb_3 and the non-emission area NEM.

The reflective layer 810 may serve to reflect light, which has been emitted from the light emitting element ED and travels upward, in a downward direction, in the first to third rear emission areas EMAa_1, EMAa_2, and EMAa_3. Since the reflective layer 810 is disposed in the first to third rear emission areas EMAa_1, EMAa_2, and EMAa_3 to cover or overlap the light emitting element ED from above, the reflective layer 810 may serve to reflect light, which has been emitted from the light emitting element ED disposed in each of the first to third rear emission areas EMAa_1, EMAa_2, and EMAa_3 and travels upward, in a downward direction, thereby emitting light toward the rear surface of the display device 1 in the first to third rear emission areas EMAa_1, EMAa_2, and EMAa_3.

The first planarization layer OC1 may be disposed on the first capping layer CAP1 on which the reflective layer 810 is disposed. The first planarization layer OC1 may have a substantially flat surface regardless of the shape or presence of the pattern disposed thereunder. For example, the first planarization layer OC1 may serve to planarize upper portions of the reflective layer 810 and the first capping layer CAP1.

The first planarization layer OC1 may include an organic material. For example, the first planarization layer OC1 may include at least one of acrylic resin, epoxy resin, phenolic resin, polyamide resin, or polyimide resin.

Figure 4:
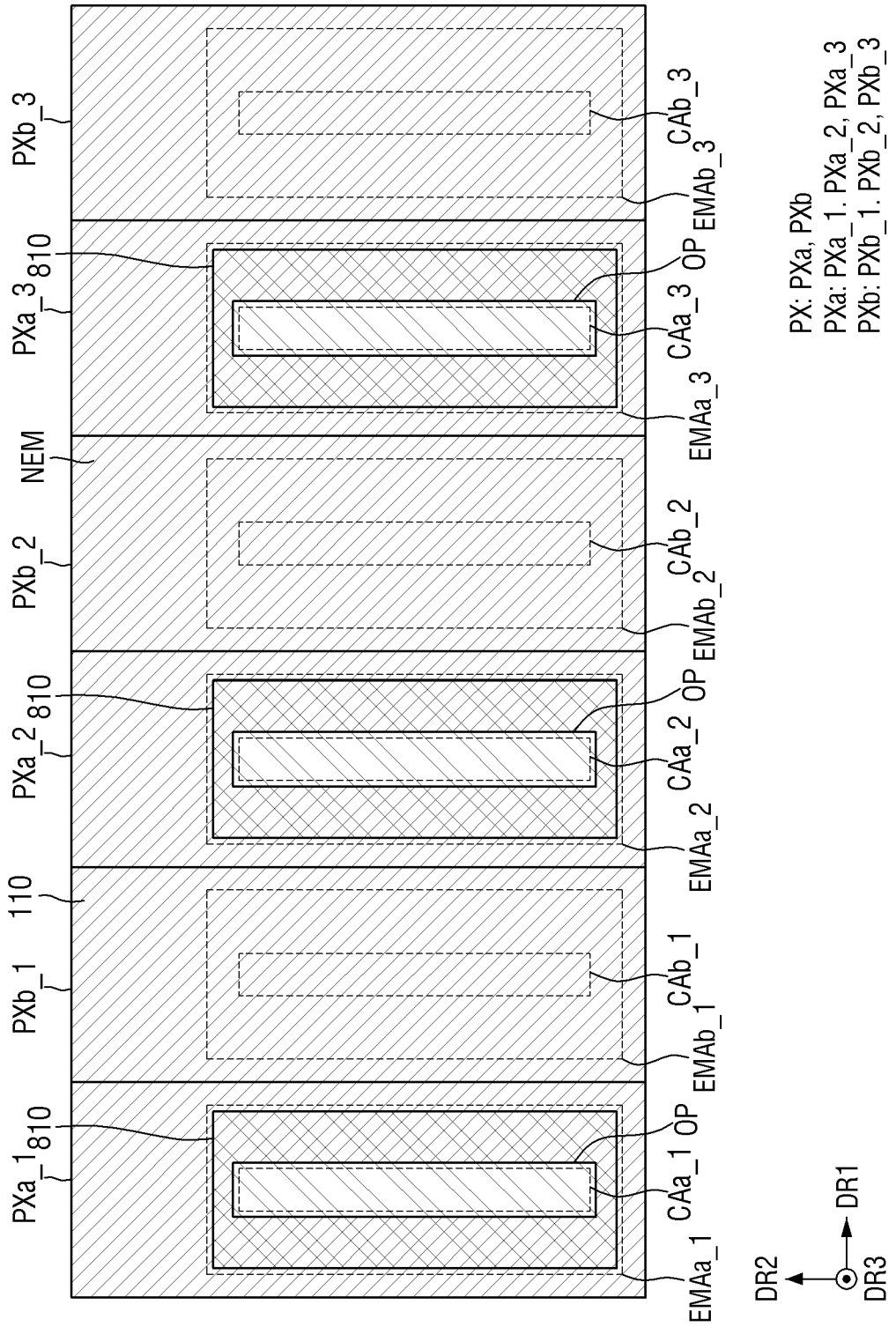
FIG. 4 is a schematic plan view illustrating a relative arrangement of the lower metal layer and the reflective layer included in the display device of FIG. 2.
Figure 5:
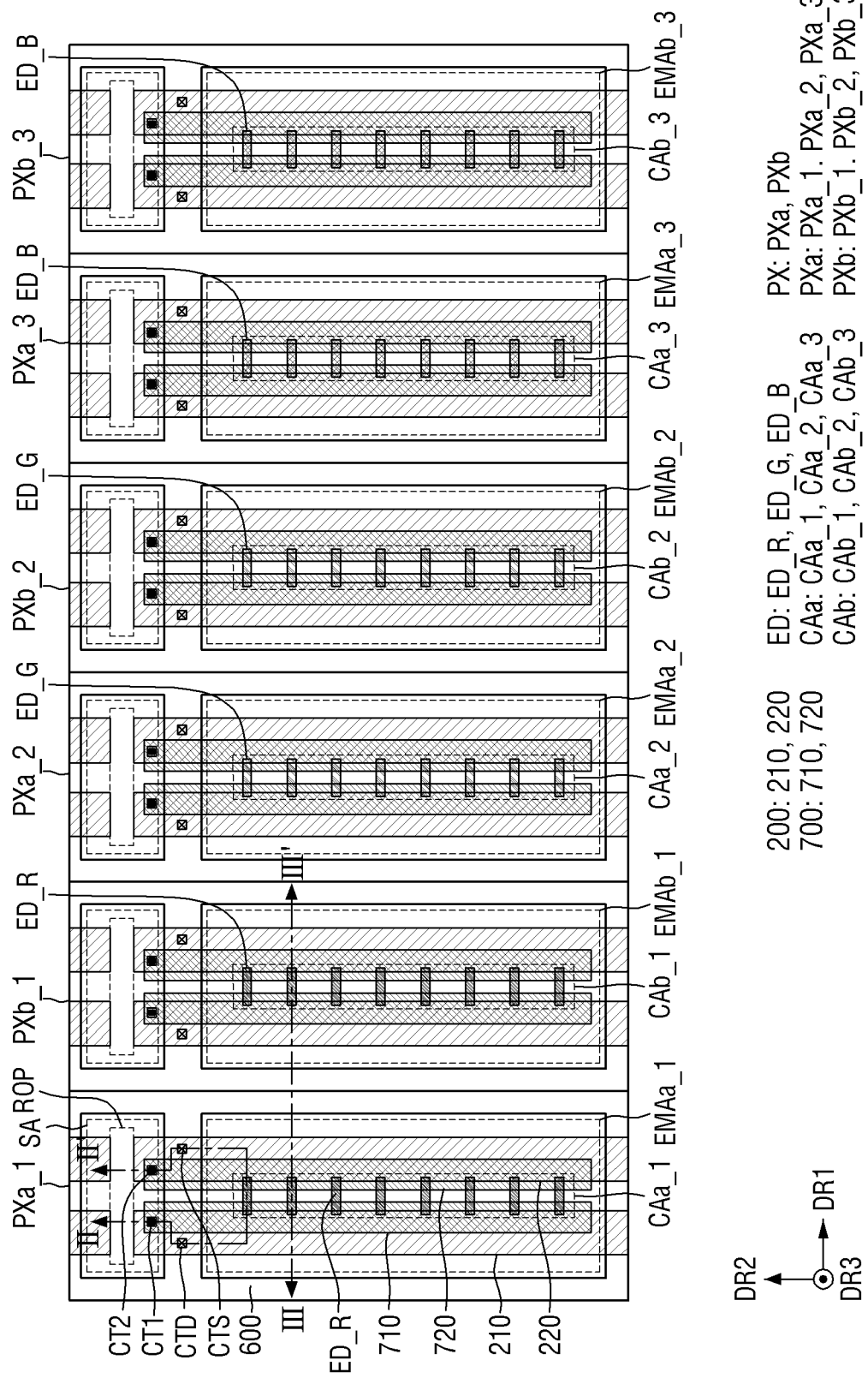
FIG. 5 is a schematic plan view of the light emitting element layer included in the display device of FIG. 2.

FIG. 4 is a plan view illustrating a relative arrangement of the lower metal layer and the reflective layer included in the display device of FIG. 2. FIG. 5 is a schematic plan view of the light emitting element layer included in the display device of FIG. 2.

Referring to FIGS. 3 to 5, the rear emission area EMAa may include a first alignment area CAa in which the light emitting elements ED are aligned, and the front emission area EMAb may include a second alignment area CAb in which the light emitting elements ED are aligned. The first alignment area CAa may be an area in which the light emitting elements ED are intensively aligned in the rear emission area EMAa. The first alignment area CAa may be a virtual area defined by the first electrode 210, the second electrode 220, and the light emitting element ED. Similarly, the second alignment area CAb may be an area in which the light emitting elements ED are intensively aligned in the front emission area EMAb. The second alignment area CAb may be a virtual area defined by the first electrode 210, the second electrode 220, and the light emitting element ED.

The first alignment area CAa may include a first sub-alignment area CAa_1, a second sub-alignment area CAa_2, and a third sub-alignment area CAa_3 that are respectively included in the first rear emission area EMAa_1, the second rear emission area EMAa_2, and the third rear emission area EMAa_3.

The second alignment area CAb may include a fourth sub-alignment area CAb_1, a fifth sub-alignment area CAb_2, and a sixth sub-alignment area CAb_3 that are respectively included in the first front emission area EMAb_1, the second front emission area EMAb_2, and the third front emission area EMAb_3.

The first type light emitting elements ED_R disposed in the first rear emission area EMAa_1 may be intensively disposed in the first sub-alignment area CAa_1. The first type light emitting elements ED_R disposed in the first front emission area EMAb_1 may be intensively disposed in the fourth sub-alignment area CAb_1. The first type light emitting elements ED_R disposed in the first and fourth sub-alignment areas CAa_1 and CAb_1 may be spaced apart from each other in the second direction DR2 in the first and fourth sub-alignment areas CAa_1 and CAb_1. The first type light emitting elements ED_R disposed in the first and fourth sub-alignment areas CAa_1 and CAb_1 may be aligned in one line across the entire area of the first and fourth sub-alignment areas CAa_1 and CAb_1. The separation distance between the first type light emitting elements ED_R disposed adjacent to each other in the second direction DR2 may be random.

The second type light emitting elements ED_G disposed in the second rear emission area EMAa_2 may be intensively disposed in the second sub-alignment area CAa_2. The second type light emitting elements ED_G disposed in the second front emission area EMAb_2 may be intensively disposed in the fifth sub-alignment area CAb_2. The second type light emitting elements ED_G disposed in the second and fifth sub-alignment areas CAa_2 and CAb_2 may be spaced apart from each other in the second direction DR2 in the second and fifth sub-alignment areas CAa_2 and CAb_2. The second type light emitting elements ED_G disposed in the second and fifth sub-alignment areas CAa_2 and CAb_2 may be aligned in one line across the entire area of the second and fifth sub-alignment areas CAa_2 and CAb_2. The separation distance between the second type light emitting elements ED_G disposed adjacent to each other in the second direction DR2 may be random.

The third type light emitting elements ED_B disposed in the third rear emission area EMAa_3 may be intensively disposed in the third sub-alignment area CAa_3. The third type light emitting elements ED_B disposed in the third front emission area EMAb_3 may be intensively disposed in the sixth sub-alignment area CAb_3. The third type light emitting elements ED_B disposed in the third and sixth sub-alignment areas CAa_3 and CAb_3 may be spaced apart from each other in the second direction DR2 in the third and sixth sub-alignment areas CAa_3 and CAb_3. The third type light emitting elements ED_B disposed in the third and sixth sub-alignment areas CAa_3 and CAb_3 may be aligned in one line across the entire area of the third and sixth sub-alignment areas CAa_3 and CAb_3. The separation distance between the third type light emitting elements ED_B disposed adjacent to each other in the second direction DR2 may be random.

The opening OP of the lower metal layer 110 may be a passage through which light that has been emitted from the light emitting element ED disposed in the rear emission area EMAa is emitted toward the rear surface of the display device 1, and the reflective layer 810 may reflect light, which has been emitted from the light emitting element ED and travels upward, in a downward direction. Accordingly, the front and rear emission efficiencies of the display device 1 may be improved according to the planar arrangement of the opening OP of the lower metal layer 110 and the planar arrangement of the reflective layer 810.

In one embodiment, the opening OP defined by the lower metal layer 110 may overlap the rear emission area EMAa in the third direction DR3. For example, the opening OP may overlap the first alignment area CAa of the rear emission area EMAa in the third direction DR3. For example, the opening OP disposed in the first rear emission pixel PXa_1 may overlap the first sub-alignment area CAa_1 of the first rear emission area EMAa_1 in the third direction DR3. The opening OP disposed in the second rear emission pixel PXa_2 may overlap the second sub-alignment area CAa_2 of the second rear emission area EMAa_2 in the third direction DR3. The opening OP disposed in the third rear emission pixel PXa_3 may overlap the third sub-alignment area CAa_3 of the third rear emission area EMAa_3 in the third direction DR3.

The lower metal layer 110 may be entirely disposed on one surface or a surface of the first substrate SUB1 except the opening OP. Accordingly, the lower metal layer 110 may be entirely disposed in the first to third front emission areas EMAb_1, EMAb_2, and EMAb_3, the non-emission area NEM, and partial areas of the first to third rear emission areas EMAa_1, EMAa_2, and EMAa_3 except the first to third sub-alignment areas CAa_1, CAa_2, and CAa_3.

Since the opening OP overlaps the first alignment area CAa in which the light emitting elements ED are intensively disposed, light emitted from the light emitting elements ED disposed in the rear emission area EMAa may mostly travel toward the opening OP arranged or disposed thereunder. Accordingly, the efficiency of light, which is emitted from the light emitting element ED of the light emitting element layer EML disposed in the rear emission area EMAa and travels toward the rear surface of the display device 1 through the opening OP, may be improved. Further, since the width of the opening OP is substantially similar to the width of the first alignment area CAa, it is possible to prevent light from being emitted toward the rear surface of the front emission area EMAb disposed adjacent thereto.

The opening OP may have a shape similar to the shape of the first alignment area CAa in a plan view. For example, in case that the first alignment area CAa has a stripe shape extending in the second direction DR2, the shape of the opening OP may also be a stripe shape extending in the second direction DR2 in a plan view.

The reflective layer 810 may be disposed in the rear emission pixel PXa, but may not be disposed in the front emission pixel PXb. The reflective layer 810 may be disposed in the rear emission area EMAa of the rear emission pixel PXa. The reflective layer 810 may be disposed to cover or overlap at least the first alignment area CAa.

The reflective layer 810 may be disposed to overlap each of the first to third rear emission areas EMAa_1, EMAa_2, and EMAa_3 in the third direction DR3. The reflective layer 810 may be disposed in each of the first to third rear emission areas EMAa_1, EMAa_2, and EMAa_3 to cover or overlap at least the first to third sub-alignment areas CAa_1, CAa_2, and CAa_3.

Hereinafter, a planar arrangement of the electrode layer 200, the contact electrode 700, the light emitting element ED, and the first bank 600, which are included in the light emitting element layer EML, will be described with reference to FIG. 5.

The structure of the light emitting element layer EML disposed in the first rear emission pixel PXa_1 may be equally applied to the first front emission pixel PXb_1. The structure of the light emitting element layer EML disposed in the first rear emission pixel PXa_1 may be equally applied to the second rear emission pixel PXa_2, the third rear emission pixel PXa_3, the first front emission pixel PXb_1, the second front emission pixel PXb_2, and the third front emission pixel PXb_3, except for the type of the light emitting element ED disposed therein. Accordingly, a description of the structure of the emitting element layer EML, which is disposed in each of the second rear emission pixel PXa_2, the third rear emission pixel PXa_3, the first front emission pixel PXb_1, the second front emission pixel PXb_2, and the third front emission pixel PXb_3, is substituted with a description of the light emitting element layer EML disposed in the first rear emission pixel PXa_1.

The first rear emission pixel PXa_1 may further include a sub-region SA disposed in the non-emission area NEM. The light emitting element ED may not be provided in the sub-region SA. The sub-region SA may be disposed above the first rear emission area EMAa_1 (or on one side or a side of the second direction DR2) in the first rear emission pixel PXa_1. The sub-region SA may be disposed between the first rear emission areas EMAa_1 of the first rear emission pixels PXa_1 disposed adjacent to each other in the second direction DR2. The sub-region SA may include a region in which an electrode layer 200 is electrically connected to a contact electrode 700 through contact portions CT1 and CT2 which will be described later.

The sub-region SA may include a separation portion ROP. The separation portion ROP of the sub-region SA may be a region at which the first electrode 210 and the second electrode 220 included in the electrode layer 200 of each of the first rear emission pixels PXa_1 adjacent to each other in the second direction DR2 are separated from each other.

The electrode layer 200 may have a shape extending in one direction or a direction and may be disposed to cross or intersect the first rear emission area EMAa_1 and the sub-region SA. The electrode layer 200 may transmit an electrical signal, which has been applied from the circuit element layer CCL, to the light emitting element ED in order to cause the light emitting element ED (or the first type light emitting element ED_R) to emit light. The electrode layer 200 may be used to generate an electric field used in a step of aligning the light emitting elements ED.

The first electrode 210 may be disposed on the left side of the first rear emission area EMAa_1 in a plan view. The first electrode 210 may have a shape extending in the second direction DR2 in a plan view. The first electrode 210 may be disposed to cross or intersect the first rear emission area EMAa_1 and the sub-region SA. The first electrode 210 may extend in the second direction DR2, while being separated from the first electrode 210 of the first rear emission pixel PXa_1 adjacent in the second direction DR2 at the separation portion ROP of the sub-region SA in a plan view.

The second electrode 220 may be separated from the first electrode 210 in the first direction DR1. The second electrode 220 may be disposed on the right side of the first rear emission area EMAa_1 in a plan view. The second electrode 220 may have a shape extending in the second direction DR2 in a plan view. The second electrode 220 may be disposed to cross or intersect the first rear emission area EMAa_1 and the sub-region SA. The second electrode 220 may extend in the second direction DR2, while being separated from the second electrode 220 of the first rear emission pixel PXa_1 adjacent in the second direction DR2 at the separation portion ROP of the sub-region SA in a plan view.

The light emitting elements ED may be disposed in the first rear emission area EMAa_1. The light emitting elements ED may not be disposed in the sub-region SA. The light emitting elements ED may be disposed in the first sub-alignment area CAa_1 including the area between the first electrode 210 and the second electrode 220.

The light emitting element ED may have a shape extending in one direction or in a direction. The light emitting element ED may be disposed such that both ends thereof are placed on the first electrode 210 and the second electrode 220, respectively. For example, the light emitting elements ED may be disposed such that one end or an end thereof is placed on the first electrode 210 and the other end or another end thereof is placed on the second electrode 220.

The length of each light emitting element ED (for example, the length of the light emitting element ED in the first direction DR1 in the drawing) may be greater than the shortest distance between the first electrode 210 and the second electrode 220 that are spaced apart from each other in the first direction DR1. The distance between the first electrode 210 and the second electrode 220 in the first direction DR1 is formed to be smaller than the length of each light emitting element ED, so that both ends of the light emitting elements ED may be disposed to be placed on the first electrode 210 and the second electrode 220, respectively.

The first contact electrode 710 may be disposed on the first electrode 210 in the first rear emission area EMAa_1. The first contact electrode 710 may have a shape extending in the second direction DR2 on the first electrode 210. The first contact electrode 710 may be in contact with the first electrode 210 via the first contact portion CT1 in the sub-region SA, and may be in contact with one ends of the light emitting elements ED in the first rear emission area EMAa_1. For example, the first contact electrode 710 may be in contact with the first electrode 210 and one end or an end of the light emitting element ED to electrically connect them to each other.

The second contact electrode 720 may be disposed on the second electrode 220 in the first rear emission area EMAa_1. The second contact electrode 720 may be spaced apart from the first contact electrode 710 in the first direction DR1. The second contact electrode 720 may have a shape extending in the second direction DR2 on the second electrode 220. The second contact electrode 720 may be in contact with the second electrode 220 via the second contact portion CT2 in the sub-region SA, and may be in contact with the other ends of the light emitting elements ED in the first rear emission area EMAa_1. For example, the second contact electrode 720 may be in contact with the second electrode 220 and the other end of the light emitting element ED to electrically connect them to each other.

Figure 6:
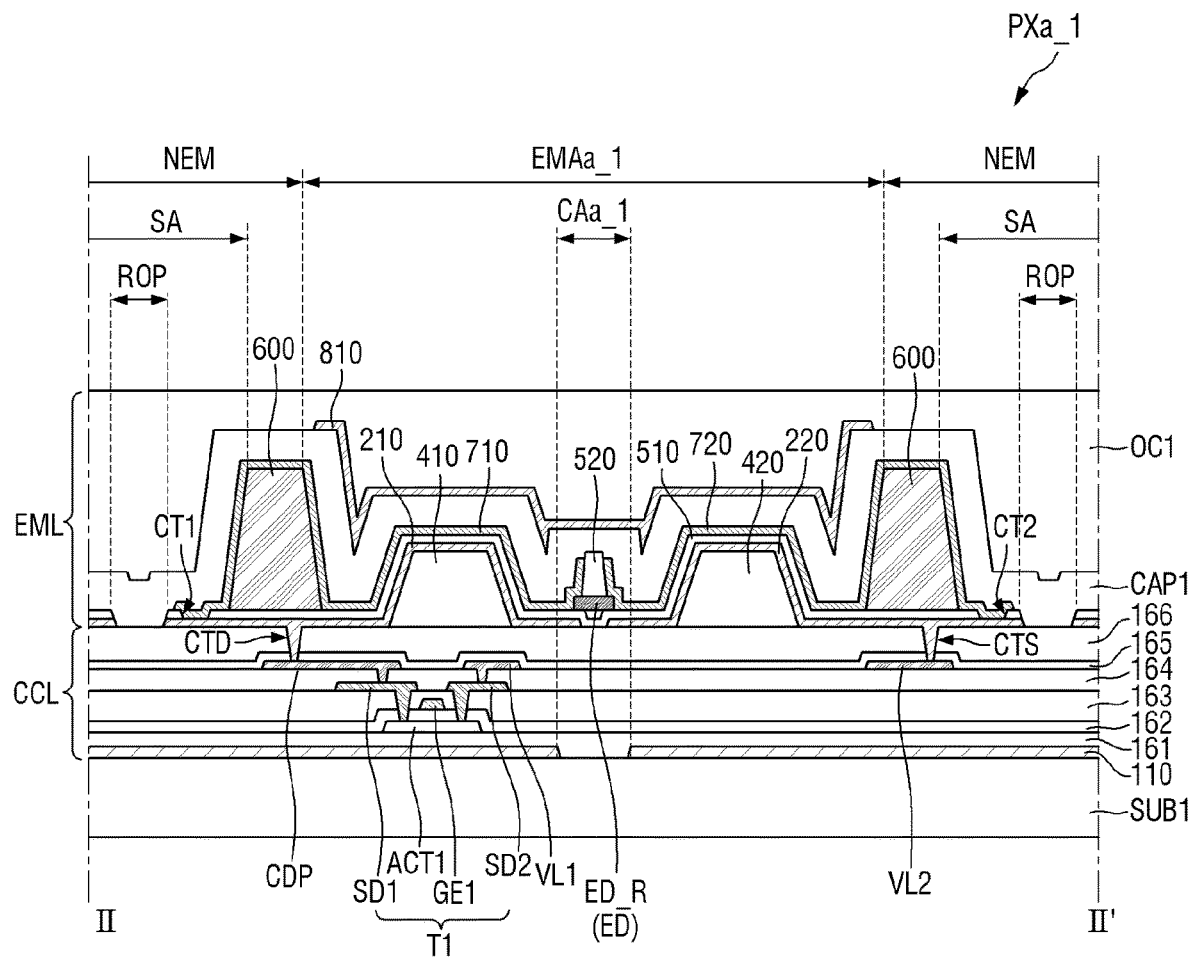
FIG. 6 is a schematic cross-sectional view taken along line II-II' of FIG. 5.

FIG. 6 is a schematic cross-sectional view taken along line II-II' of FIG. 5.

Referring to FIG. 6, the circuit element layer CCL may include a lower metal layer 110, a semiconductor layer 120, a first conductive layer 130, a second conductive layer 140, a third conductive layer 150, and insulating layers.

The lower metal layer 110 may be disposed on one surface or a surface of the first substrate SUB1. The lower metal layer 110 may include the opening OP that overlaps the first sub-alignment area CAa_1 in the third direction DR3. The lower metal layer 110 may be entirely disposed on one surface or a surface of the first substrate SUB except the opening OP.

In one embodiment, the lower metal layer 110 may contain a material that blocks light. The lower metal layer 110 may be formed of an opaque metal material or a light blocking material that blocks light transmission. Since the lower metal layer 110 may include a light blocking material, some lights, which have been emitted from the light emitting element layer EML and travel downward, may travel toward the opening OP of the lower metal layer 110, and may be emitted toward the rear surface of the display device 1. Other lights may travel toward the top surface of the lower metal layer 110, and may be blocked by the lower metal layer 110, so that the lights may not be emitted toward the rear surface of the display device 1. The lower metal layer 110 may serve to control the emission direction of light such that light is emitted through the rear surface of the display device 1 in the rear emission area EMAa, and light is not emitted through the rear surface of the display device 1 in the front emission area EMAb.

The buffer layer 161 may be disposed on the lower metal layer 110 to entirely cover or overlap the first substrate SUB1 on which the lower metal layer 110 is disposed.

The semiconductor layer 120 is disposed on the buffer layer 161. The semiconductor layer 120 may include a first active pattern ACT1 of a first transistor T1.

The semiconductor layer 120 may include polycrystalline silicon, monocrystalline silicon, an oxide semiconductor, or the like within the spirit and the scope of the disclosure. In an embodiment, in case that the semiconductor layer contains polycrystalline silicon, the polycrystalline silicon may be formed by crystallizing amorphous silicon. In case that the semiconductor layer contains polycrystalline silicon, the active layer ACT of the transistor TR may include doping regions doped with impurities and channel regions disposed therebetween. In an embodiment, the semiconductor layer may contain an oxide semiconductor. The oxide semiconductor may be, for example, indium tin oxide (ITO), indium zinc oxide (IZO), indium gallium oxide (IGO), indium zinc tin oxide (IZTO), indium gallium zinc oxide (IGZO), indium gallium tin oxide (IGTO), indium gallium zinc tin oxide (IGZTO) or the like within the spirit and the scope of the disclosure.

A gate insulating layer 162 may be disposed on the semiconductor layer 120. The gate insulating layer 162 may function as a gate insulating layer of each transistor. The gate insulating layer 162 may be formed as a multilayer in which inorganic layers including an inorganic material, for example, at least one of silicon oxide ($SiO_x$), silicon nitride ($SiN_x$) or silicon oxynitride ($SiO_xN_y$) may be alternately stacked each other.

The first conductive layer 130 may be disposed on the gate insulating layer 162. The first conductive layer 130 may include a first gate electrode GE1 of the first transistor T1. The first gate electrode GE1 may be disposed to overlap the channel region of the first active pattern ACT1 in the third direction DR3.

A first interlayer insulating layer 163 may be disposed on the first conductive layer 130. The first interlayer insulating layer 163 may be disposed to cover or overlap the first gate electrode GE1. The first interlayer insulating layer 163 may function as an insulating layer between the first conductive layer 130 and other layers disposed thereon to protect the first conductive layer 130.

A second conductive layer 140 may be disposed on the first interlayer insulating layer 163. The second conductive layer 140 may include a source electrode SD1 of the first transistor T1 and a drain electrode SD2 of the first transistor T1.

The source electrode SD1 of the first transistor T1 and the drain electrode SD2 of the first transistor T1 may be electrically connected to both end regions of the first active pattern ACT1 of the first transistor T1 through contact holes penetrating the first interlayer insulating layer 163 and the gate insulating layer 162, respectively.

A second interlayer insulating layer 164 may be disposed on the second conductive layer 140. The second interlayer insulating layer 164 may be disposed to cover or overlap the source electrode SD1 of the first transistor T1 and the drain electrode SD2 of the first transistor T1. The second interlayer insulating layer 164 may function as an insulating layer between the second conductive layer 140 and other layers disposed thereon, and may protect the second conductive layer 140.

A third conductive layer 150 may be disposed on the second interlayer insulating layer 164. The third conductive layer 150 may include a first voltage line VL1, a second voltage line VL2, and a conductive pattern CDP.

The first voltage line VL1 may overlap at least a part of the drain electrode SD2 of the first transistor T1 in the third direction DR3. A high potential voltage (or a first power voltage) supplied to the first transistor T1 may be applied to the first voltage line VL1.

The second voltage line VL2 may be electrically connected to the second electrode 220 through the second electrode contact hole CTS penetrating a via layer 166 and a passivation layer 165 to be described below. A low potential voltage (or a second source voltage) lower than the high potential voltage supplied to the first voltage line VL1 may be applied to the second voltage line VL2. For example, the high potential voltage (or the first power voltage) supplied to the first transistor T1 may be applied to the first voltage line VL1, and the low potential voltage (or the second power voltage) lower than the high potential voltage supplied to the first voltage line VL1 may be applied to the second voltage line VL2.

The conductive pattern CDP may be electrically connected to the source electrode SD1 of the first transistor T1. The conductive pattern CDP may be electrically connected to the source electrode SD1 of the first transistor T1 through the contact hole penetrating the second interlayer insulating layer 164. Further, the conductive pattern CDP may be electrically connected to the first electrode 210 through a first electrode contact hole CTD that penetrates the via layer 166 and the passivation layer 165, which will be described later. The first transistor T1 may transmit the first source voltage applied from the first voltage line VL1 to the first electrode 210 through the conductive pattern CDP.

The passivation layer 165 may be disposed on the third conductive layer 150. The passivation layer 165 may be disposed to cover or overlap the third conductive layer 150. The passivation layer 165 may serve to protect the third conductive layer 150.

The via layer 166 may be disposed on the passivation layer 165. The via layer 166 may include an organic insulating material, for example, an organic material such as polyimide (PI). The via layer 166 may function to flatten a surface. Accordingly, the top surface (or the surface) of the via layer 166, on which the light emitting element layer is disposed, may be substantially flat regardless of a shape or presence of a pattern disposed thereunder.

Each of the gate insulating layer 162, the first interlayer insulating layer 163, the second interlayer insulating layer 164, and the passivation layer 165 described above may be formed of inorganic layers that may be alternately stacked each other. For example, the buffer layer 161, the gate insulating layer 162, the first interlayer insulating layer 163, the second interlayer insulating layer 164, and the passivation layer 165 described above may be formed as a double layer formed by stacking, or a multilayer formed by alternately stacking, inorganic layers including at least one of silicon oxide ($SiO_x$), silicon nitride ($SiN_x$), or silicon oxynitride ($SiO_xN_y$). However, the disclosure is not limited thereto, and the gate insulating layer 162, the first interlayer insulating layer 163, the second interlayer insulating layer 164, and the passivation layer 165 described above may be formed as a single inorganic layer containing the above-described insulating material.

The light emitting element layer EML may further include a second bank 400, a first insulating layer 510, and a second insulating layer 520.

The second bank 400 may be disposed on the via layer 166 in the first rear emission area EMAa_1. The second bank 400 may be directly disposed on one surface or a surface of the via layer 166. The second bank 400 may have a structure in which at least a part of the first bank 400 protrudes upward (for example, one side or a side in the third direction DR3) with respect to one surface or a surface of the via layer 166. The protruding part of the second bank 400 may have an inclined side surface. The second bank 400 may serve to change the traveling direction of the light emitted from the light emitting element ED toward the inclined side surface of the second bank 400 to an upward direction (for example, a display direction).

The second bank 400 may include a first sub-bank 410 and a second sub-bank 420 spaced apart from each other. The first sub-bank 410 and the second sub-bank 420, which are spaced apart from each other, may provide a space in which the light emitting element ED is disposed, while assisting the function of a reflective partition wall that changes the traveling direction of the light emitted from the light emitting element ED to the display direction.

Although it is illustrated in the drawing that the side surface of the second bank 400 is inclined in a linear shape, the disclosure is not limited thereto. For example, the side surface (or outer surface) of the second bank 400 may have a curved semicircular or semi-elliptical shape. In an embodiment, the second bank 400 may include an organic insulating material such as polyimide (PI), but is not limited thereto.

The electrode layer 200 may be disposed on the second bank 400 and the via layer 166 exposed by the second bank 400. In the first rear emission area EMAa_1, the electrode layer 200 may be disposed on the second bank 400, and in the non-emission area NEM, the electrode layer 200 may be disposed on the via layer 166 exposed by the second bank 400.

In the first rear emission area EMAa_1, the first electrode 210 and the second electrode 220 may be disposed on the first sub-bank 410 and the second sub-bank 420, respectively. The first electrode 210 may extend outward from the first sub-bank 410 and may also be disposed on the via layer 166 exposed by the first sub-bank 410. Similarly, the second electrode 220 may extend outward from the second sub-bank 420 and may also be disposed on the via layer 166 exposed by the second sub-bank 420. The first electrode 210 and the second electrode 220 may be spaced apart from each other and face each other in a separation region between the first sub-bank 410 and the second sub-bank 420. The via layer 166 may be exposed in the region where the first electrode 210 and the second electrode 220 are spaced apart from each other and face each other.

The first electrode 210 may be spaced apart from the first electrode 210 of the first rear emission pixel PXa_1, which is adjacent in the second direction DR2, with the separation portion ROP interposed therebetween, in the sub-region SA. Similarly, the second electrode 220 may be spaced apart from the second electrode 220 of the first rear emission pixel PXa_1, which is adjacent in the second direction DR2, with the separation portion ROP interposed therebetween, in the sub-region SA. Accordingly, the first electrode 210 and the second electrode 220 may expose the via layer 166 in the separation portion ROP of the sub-region SA.

The first electrode 210 may be electrically connected to the conductive pattern CDP of the circuit element layer through the first electrode contact hole CTD penetrating the via layer 166 and the passivation layer 165. For example, the first electrode 210 may be in contact with the top surface of the conductive pattern CDP exposed by the first electrode contact hole CTD. The first source voltage applied from the first voltage line VL1 may be transmitted to the first electrode 210 through the conductive pattern CDP.

The second electrode 220 may be electrically connected to the second voltage line VL2 of the circuit element layer through the second electrode contact hole CTS penetrating the via layer 166 and the passivation layer 165. For example, the second electrode 220 may be in contact with the top surface of the second voltage line VL2 exposed by the second electrode contact hole CTS. The second source voltage applied from the second voltage line VL2 may be transmitted to the second electrode 220.

The electrode layer 200 may include a conductive material having high reflectivity. For example, the electrode layer 200 may include a metal such as silver (Ag), copper (Cu), or aluminum (Al) as a material having high reflectivity, or may include an alloy including aluminum (Al), nickel (Ni), lanthanum (La), and the like within the spirit and the scope of the disclosure. The electrode layer 200 may reflect the light emitted from the light emitting element ED and traveling toward the side surface of the second bank 400.

However, the disclosure is not limited thereto, and the electrode layer 200 may further include a transparent conductive material. For example, the electrode layer 200 may include a material such as ITO, IZO, and ITZO. In an embodiment, the electrode layer 200 may have a structure in which at least one transparent conductive material and at least one metal layer having high reflectivity may be stacked each other, or may be formed as one layer or as a layer including them. For example, the electrode layer 200 may have a stacked structure of ITO/Ag/ITO, ITO/Ag/IZO, ITO/Ag/ITZO/IZO, or the like within the spirit and the scope of the disclosure.

The first insulating layer 510 may be disposed on the via layer 166 on which the electrode layer 200 is formed. The first insulating layer 510 may protect the electrode layer 200 while insulating the first electrode 210 from the second electrode 220.

The first insulating layer 510 may include an inorganic insulating material. For example, the first insulating layer 510 may include at least one of inorganic insulating materials such as silicon oxide ($SiO_x$), silicon nitride ($SiN_x$), silicon oxynitride ($SiO_xN_y$), aluminum oxide ($Al_xO_y$), and aluminum nitride (AlN). The first insulating layer 510 made of an inorganic material may have a surface shape reflecting the pattern shape of the electrode layer 200 disposed thereunder. For example, the first insulating layer 510 may have a stepped structure according to the shape of the electrode layer 200 disposed under or below the first insulating layer 510.

The first insulating layer 510 may include a first contact portion CT1 partially exposing the top surface of the first electrode 210 and a second contact portion CT2 partially exposing the top surface of the second electrode 220 in the sub-region SA. The first electrode 210 may be electrically connected to a first contact electrode 710, which will be described later, through the first contact portion CT1 penetrating the first insulating layer 510 in the sub-region SA. The second electrode 220 may be electrically connected to a second contact electrode 720, which will be described later, through the second contact portion CT2 penetrating the first insulating layer 510 in the sub-region SA.

The first bank 600 may be disposed on the first insulating layer 510. The first bank 600 may be disposed in the form of a grid pattern including portions extending in the first and second directions DR1 and DR2 in a plan view.

The first bank 600 may separate the first rear emission area EMAa_1 from the sub-region SA. Since the first bank 600 may be formed to have a greater height than the second bank 400, inks, in which the light emitting elements ED are dispersed, may be sprayed into the first rear emission area EMAa_1 without being mixed between the adjacent pixels PX in the inkjet printing step for aligning the light emitting elements ED during the manufacturing process of the display device 1.

The light emitting elements ED may be disposed on the first insulating layer 510 between the first sub-bank 410 and the second sub-bank 420. The light emitting elements ED may be disposed between the first electrode 210 and the second electrode 220 on the first insulating layer 510.

The second insulating layer 520 may be disposed on the light emitting element ED. The second insulating layer 520 may be disposed to partially surround the outer surface of the light emitting element ED, but not to cover or overlap the both ends of the light emitting element ED. Therefore, the width of the second insulating layer 520 in the first direction DR1 may be smaller than the length of the light emitting element ED in the first direction DR1 that is the extension direction of the light emitting element ED. A part of the second insulating layer 520 disposed on the light emitting element ED may be disposed on the first insulating layer 510 to extend in the second direction DR2 in a plan view, so that it may form a linear or island-like pattern in the first rear emission pixel PXa_1. The second insulating layer 520 may serve to protect the light emitting element ED and fix the light emitting element ED in the manufacturing process of the display device 10.

The contact electrode 700 may be disposed on the second insulating layer 520. The contact electrode 700 may include contact electrodes spaced apart from each other. For example, the contact electrode 700 may include the first contact electrode 710 and the second contact electrode 720 spaced apart from each other.

The first contact electrode 710 may be disposed on the first electrode 210 and the second insulating layer 520. The first contact electrode 710 may be disposed to expose the top surface of the second insulating layer 520.

The first contact electrode 710 may be in contact with one end or an end of the light emitting element ED exposed by the second insulating layer 520 in the first rear emission area EMAa_1. Further, the first contact electrode 710 may be in contact with the first electrode 210 that is exposed by the first contact portion CT1 penetrating the first insulating layer 510 in the sub-region SA. Since the first contact electrode 710 is in contact with each of the first electrode 210 and one end or an end of the light emitting element ED, the first contact electrode 710 may serve to electrically connect one end or an end of the light emitting element ED to the first electrode 210.

The second contact electrode 720 may be disposed on the second electrode 220 and the second insulating layer 520. The second contact electrode 720 may be disposed to expose the top surface of the second insulating layer 520. The second contact electrode 720 may be spaced apart from the first contact electrode 710 with the second insulating layer 520 interposed therebetween.

The second contact electrode 720 may be in contact with the other end of the light emitting element ED exposed by the second insulating layer 520 in the first rear emission area EMAa_1. Further, the second contact electrode 720 may be in contact with the second electrode 220 that is exposed by the second contact portion CT2 penetrating the first insulating layer 510 in the sub-region SA. Since the second contact electrode 720 is in contact with each of the second electrode 220 and the other end or another end of the light emitting element ED, the second contact electrode 720 may serve to electrically connect the second electrode 220 to the other end or another end of the light emitting element ED.

The contact electrode 700 may include a conductive material. For example, the contact electrode 700 may include ITO, IZO, ITZO, aluminum (Al), or the like within the spirit and the scope of the disclosure. For example, the contact electrode 700 may include a transparent conductive material, and light emitted from the light emitting element ED may pass through the contact electrode 700 to travel toward the first electrode 210 and the second electrode 220 and may be reflected from the outer surface of the first electrode 210 and the second electrode 220.

The first capping layer CAP1 may be disposed above the contact electrode 700. The first capping layer CAP1 may be disposed to entirely cover or overlap the first substrate SUB1, thereby protecting the second bank 400, the electrode layer 200, the light emitting elements ED, the contact electrode 700, and the first bank 600 disposed thereunder.

Further, in an embodiment in which the first contact electrode 710 and the second contact electrode 720 are formed on a same layer, first capping layer CAP1 may serve to prevent an electrical connection between the first contact electrode 710 and the second contact electrode 720 by the reflective layer 810. In case that the first contact electrode 710 and the second contact electrode 720 are formed on a same layer, the first capping layer CAP1 including an insulating material is formed on the first contact electrode 710 and the second contact electrode 720, and then the reflective layer 810 is disposed thereon, so that the first contact electrode 710 and the second contact electrode 720 included in the first rear emission pixel PXa_1 may be electrically insulated from each other.

The reflective layer 810 may be disposed on the first capping layer CAP1. The reflective layer 810 may overlap the first rear emission area EMAa_1 in the third direction DR3. The reflective layer 810 may cover or overlap the light emitting elements ED from above. Accordingly, light emitted from the light emitting element ED disposed in the first rear emission area EMAa_1 may not be emitted toward the front surface of the display device 1.

The reflective layer 810 may include a reflective material. The reflective layer 810 may be formed of a material including metal such as aluminum (Al), nickel (Ni), lanthanum (La), silver (Ag), an alloy thereof, indium tin oxide (ITO), indium zinc oxide (IZO), indium tin-zinc oxide (ITZO) and the like, but is not limited thereto.

The first planarization layer OC1 may be disposed on the first capping layer 810. The first planarization layer OC1 may serve to planarize an upper portion of the first capping layer 810.

Figure 7:
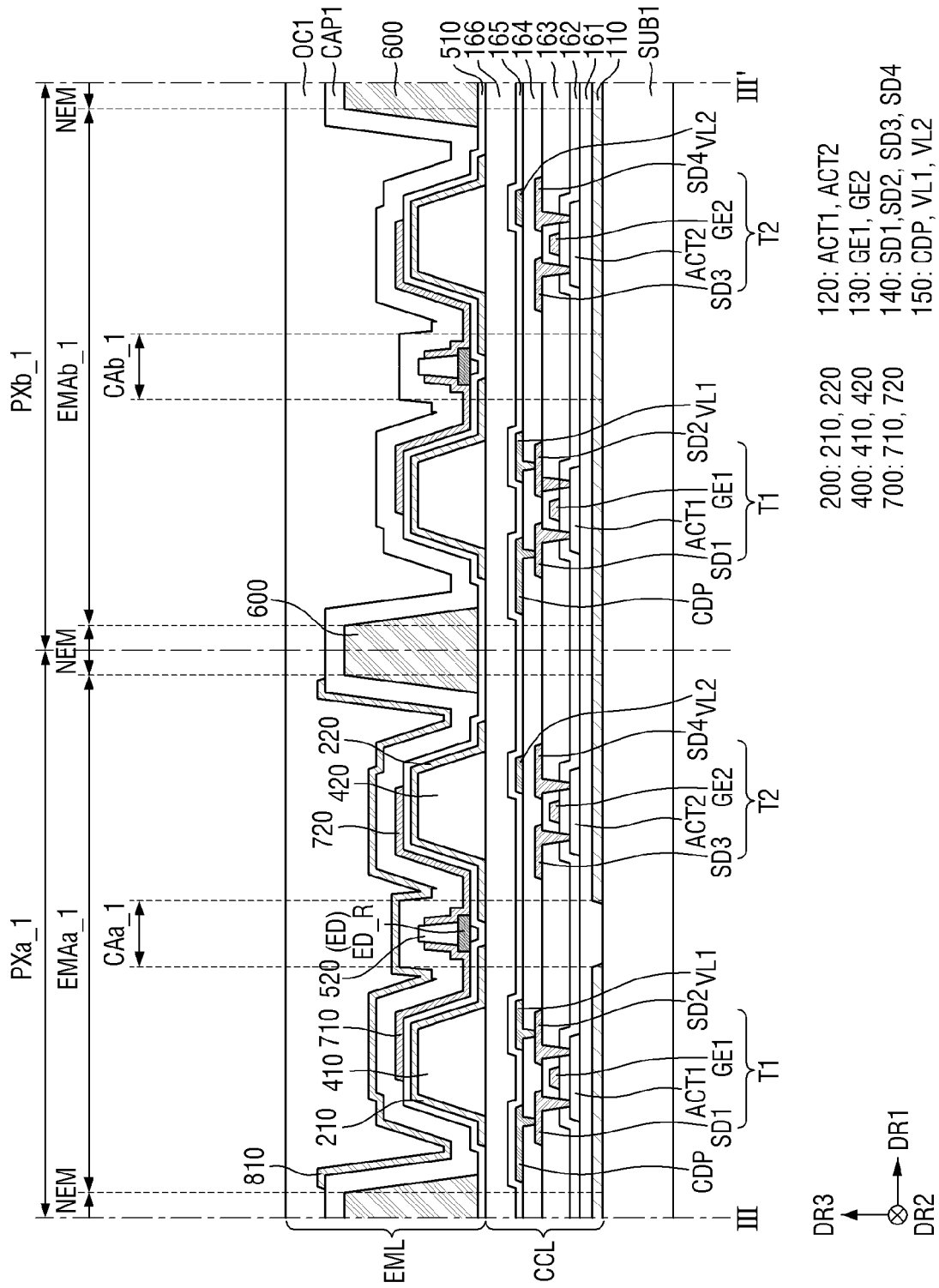
FIG. 7 is a schematic cross-sectional view illustrating an example taken along line III-III' of FIG. 5.

FIG. 7 is a schematic cross-sectional view illustrating an example taken along line III-III' of FIG. 5.

FIG. 7 illustrates a schematic cross-sectional structure of the first rear emission pixel PXa_1 and the first front emission pixel PXb_1.

The first rear emission pixel PXa_1 and the first front emission pixel PXb_1 may include the first transistor T1 and a second transistor T2, respectively. Each of the first transistor T1 and the second transistor T2 may be formed with the semiconductor layer 120, and the first and second conductive layers 130 and 140, respectively.

For example, the first transistor T1 may include the first active pattern ACT1, the first gate electrode GE1, the source electrode SD1, and the drain electrode SD2. The first active pattern ACT1 may be formed with the semiconductor layer 120, the first gate electrode GE1 may be formed with the first conductive layer 130, and the source and drain electrodes SD1 and SD2 may be formed with the second conductive layer 140. Similarly, the second transistor T2 may include a second active pattern ACT2, a second gate electrode GE2, a source electrode SD3, and a drain electrode SD4. The second active pattern ACT2 may be formed with the semiconductor layer 120, the second gate electrode GE2 may be formed with the first conductive layer 130, and the source and drain electrodes SD3 and SD4 may be formed with the second conductive layer 140.

The first transistor T1, the second transistor T2, and the voltage lines VL1 and VL2 included in the circuit element layer CCL may be formed with at least one of the first to third conductive layers 130, 140, and 150. In case that the first to third conductive layers 130, 140, and 150 at least partially overlap the opening OP of the lower metal layer 110, parts of the first to third conductive layers 130, 140, and 150 may be visibly recognized through the opening OP. Accordingly, the opening OP defined by the first sub-alignment area CAa_1 and the lower metal layer 110 may not overlap the first transistor T1, the second transistor T2, and the voltage lines VL1 and VL2 included in the circuit element layer CCL in the third direction DR3. For example, the lower metal layer 110 may be disposed under or below the first to third conductive layers 130, 140, and 150 to completely cover or overlap them.

The reflective layer 810 may be disposed in the first rear emission pixel PXa_1, but may not be disposed in the first front emission pixel PXb_1. Accordingly, light emitted from the light emitting element ED disposed in the first rear emission pixel PXa_1 may not be emitted toward the front surface of the display device 1 by the reflective layer 810, but light emitted from the light emitting element ED disposed in the first front emission pixel PXb_1 may be emitted toward the front surface of the display device 1.

In accordance with the display device 1 according to the embodiment, it is possible to provide a double-sided display device 1 capable of emitting light from the front and rear surfaces by a single display device 1.

Figure 8:
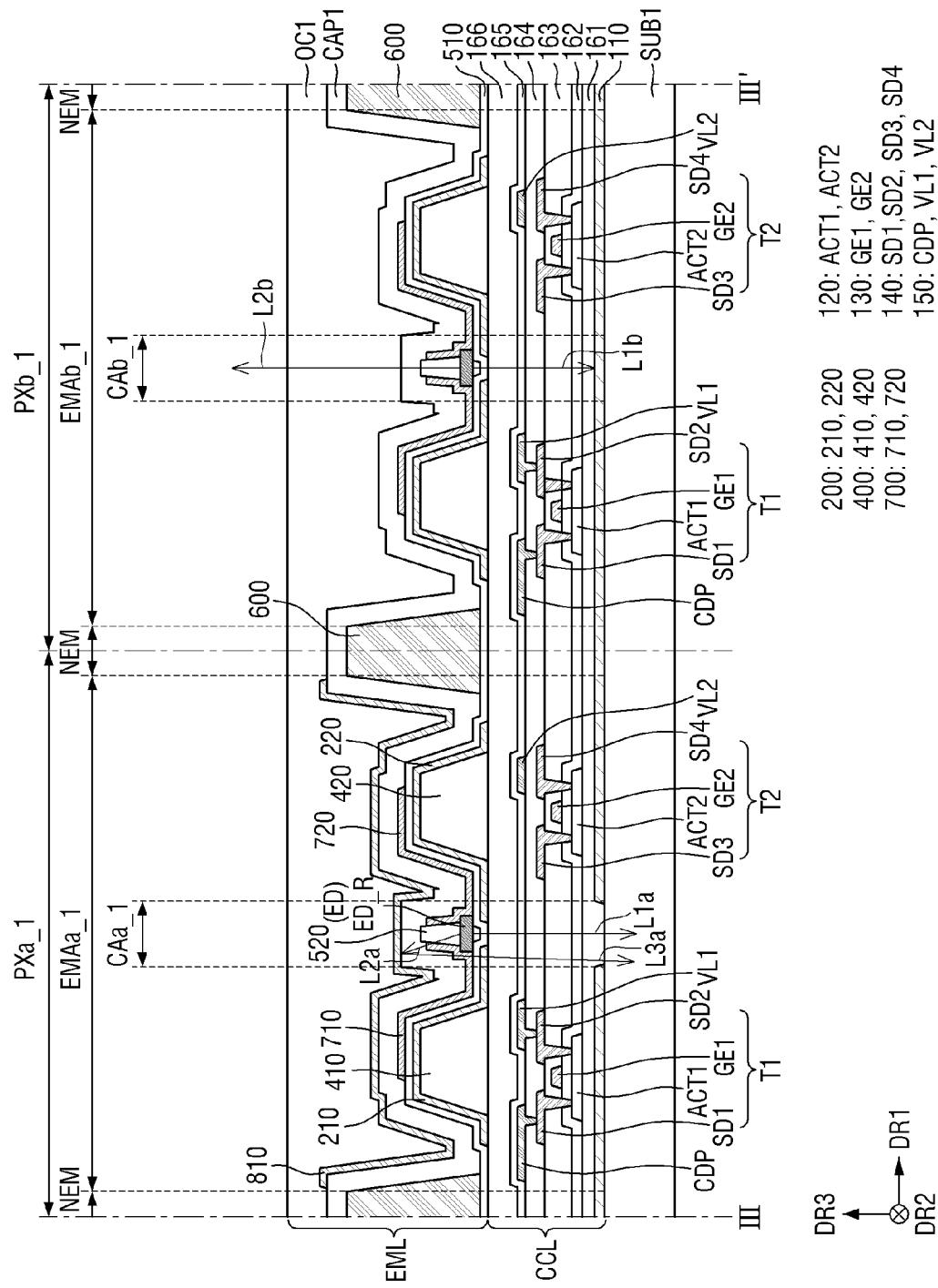
FIG. 8 is a schematic cross-sectional view illustrating a path of light emitted from a light emitting element layer of a display device according to one embodiment.

FIG. 8 is a schematic cross-sectional view illustrating a path of light emitted from a light emitting element layer of a display device according to one embodiment.

Referring to FIG. 8, the traveling direction of light emitted from the light emitting element ED may be random. For example, light emitted from the light emitting element ED may travel in an upward direction, a downward direction, and a lateral direction in the schematic cross-sectional view of the display device 1.

Among lights that are emitted from the light emitting element ED disposed in the first rear emission area EMAa_1, downwardly traveling light L1a may pass through the gap area between the first electrode 210 and the second electrode 220 and travel downward. As described above, since the first sub-alignment area CAa_1 does not overlap the conductive layers of the circuit element layer CCL, the light L1a, which has been emitted from the light emitting element ED and travels downward, may pass through the insulating layers of the circuit element layer CCL and travel toward the opening OP of the lower metal layer 110. The light L1a having passed through the opening OP of the lower metal layer 110 may be emitted through the rear surface of the display device 1.

Among the lights that are emitted from the light emitting element ED disposed in the first rear emission area EMAa_1, upwardly traveling light L2a may be reflected from the reflective layer 810 disposed thereabove and travel downward. Light L3a reflected from the reflective layer 810 and traveling downward may pass through the opening OP of the lower metal layer 110 and may be emitted through the rear surface of the display device 1.

Among lights that are emitted from the light emitting element ED disposed in the first front emission area EMAb_1, downwardly traveling light L1b may pass through the gap area between the first electrode 210 and the second electrode 220 and travel downward. The light L1b emitted from the light emitting element ED and traveling downward may pass through the insulating layers of the circuit element layer CCL and may be incident on the top surface of the lower metal layer 110. Accordingly, among the lights that are emitted from the light emitting element ED disposed in the first front emission area EMAb_1, the downwardly traveling light L1b may be blocked by the lower metal layer 110, and thus it may not be emitted through the rear surface of the display device 1.

Among the lights that are emitted from the light emitting element ED disposed in the first front emission area EMAb_1, upwardly traveling light L2b may be emitted through the front surface of the display device 1.

Figure 9:
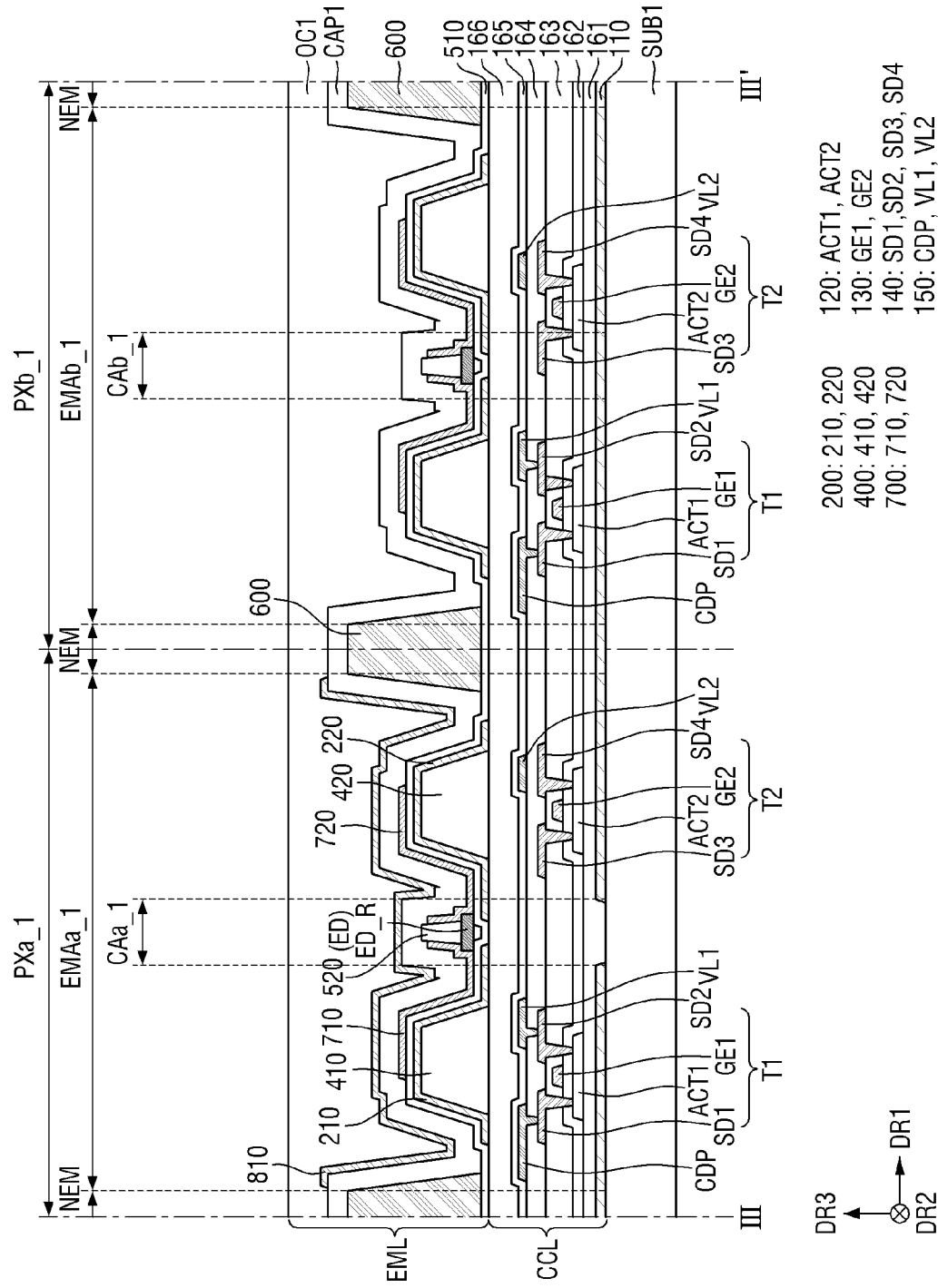
FIG. 9 is a schematic cross-sectional view illustrating an example taken along line III-III' of FIG. 5.

FIG. 9 is a schematic cross-sectional view illustrating an example taken along line III-III' of FIG. 5.

Referring to FIG. 9, the display device 1 according to an embodiment may be different from that of an embodiment of FIG. 7 in that the first and second transistors T1 and T2 included in the first rear emission pixel PXa_1 may be disposed not to overlap the first sub-alignment area CAa_1 in the third direction DR3, and at least one of the first and second transistors T1 and T2 included in the first front emission pixel PXb_1 may be disposed to overlap the fourth sub-alignment area CAb_1 in the third directions DR3.

For example, the transistors and the lines included in the circuit element layer CCL may not overlap the opening OP of the lower metal layer 110 in the third direction DR3. In other words, the lower metal layer 110 may cover or overlap the first and second transistors T1 and T2 included in the first rear emission pixel PXa_1 and the first and second transistors T1 and T2 included in the first front emission pixel PXb_1, and the lines.

If the first to third conductive layers 130, 140, and 150 constituting the transistors and/or the lines overlap the opening OP of the lower metal layer 110 in the third direction DR3, parts of the first to third conductive layers 130, 140, and 150 may be visually recognized from the rear surface of the display device 1 through the opening OP. Accordingly, the first and second transistors T1 and T2 and the lines disposed in the first rear emission area EMAa_1 may not overlap the opening OP in the third direction DR3 such that first to third conductive layers 130, 140, and 150 may not be visually recognized from the rear surface through the opening OP of the lower metal layer 110. Further, since the first and second transistors T1 and T2, and the lines, which are disposed in the first rear emission area EMAa_1, do not overlap the opening OP in the third direction DR3, the first to third conductive layers 130, 140, and 150 may not overlap the first sub-alignment area CAa_1 in the first rear emission area EMAa_1.

The lower metal layer 110 may completely cover or overlap the first and second transistors T1 and T2 and the lines disposed in the first front emission area EMAb_1. Accordingly, although the first and second transistors T1 and T2 and the voltage lines, which are disposed in the first front emission area EMAb_1, partially overlap the fourth sub-alignment area CAb_1, the conductive layers may not be visually recognized from the rear surface of the display device 1.

In accordance with the display device 1 according to the embodiment, the transistors or the lines, which are disposed in the rear emission area EMAa, may be designed not to overlap the first alignment area CAa and/or the opening OP, while the transistors or the lines, which are disposed in the front emission area EMAb, may be designed in the front emission area EMAb regardless of the position of the second alignment area CAb. Accordingly, the transistors and the voltage lines can be designed with ease, and thus the manufacturing process efficiency of the display device 1 can be improved.

Figure 10:
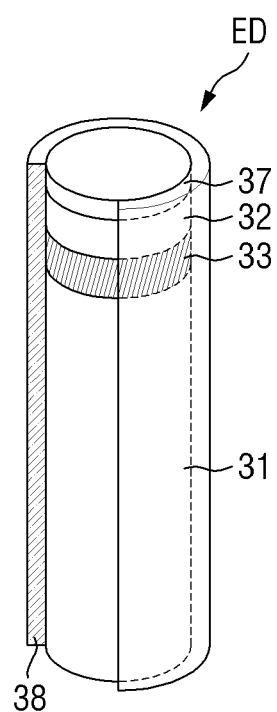
FIG. 10 is a schematic perspective view of a light emitting element according to one embodiment.

FIG. 10 is a schematic perspective view of a light emitting element according to one embodiment.

Referring to FIG. 10, the light emitting element ED which may be a particulate element may have a rod or cylindrical shape having an aspect ratio. The length of the light emitting element ED may be larger than the diameter of the light emitting element ED, and the aspect ratio may be about 6:5 to about 100:1, but the disclosure is not limited thereto.

The light emitting element ED may have a size of a nanometer scale (equal to or greater than 1 about nm and less than about 1 μm) to a micrometer scale (equal to or greater than about 1 μm and less than about 1 mm). In one embodiment, both the diameter and the length of the light emitting element ED may be on a nanometer scale, or on a micrometer scale. In an embodiment, the diameter of the light emitting element ED may be on a nanometer scale, while the length of the light emitting element ED may be on a micrometer scale. In an embodiment, some or a number of the light emitting elements ED may have a diameter and/or length on a nanometer scale, while some or a number of others of the light emitting elements ED may have a diameter and/or length on a micrometer scale.

In one embodiment, the light emitting element ED may be an inorganic light emitting diode. The inorganic light emitting diode may include semiconductor layers. For example, the inorganic light emitting diode may include a first conductivity type (for example, n-type) semiconductor layer, a second conductivity type (for example, p-type) semiconductor layer, and an active semiconductor layer interposed therebetween. The active semiconductor layer may receive holes and electrons from the first conductivity type semiconductor layer and the second conductivity type semiconductor layer, respectively, and the holes and electrons that have reached the active semiconductor layer may be coupled to emit light.

In one embodiment, the above-described semiconductor layers may be sequentially stacked each other along one direction or along a direction, which may be a length direction of the light emitting element ED. The light emitting element ED may include a first semiconductor layer 31, an element active layer 33, and a second semiconductor layer 32 that may be sequentially stacked each other in one direction or in a direction. The first semiconductor layer 31, the element active layer 33, and the second semiconductor layer 32 may be the first conductivity type semiconductor layer, the active semiconductor layer, and the second conductivity type semiconductor layer described above, respectively.

The first semiconductor layer 31 may be doped with a first conductivity type dopant. The first conductivity type dopant may be Si, Ge, Sn, or the like within the spirit and the scope of the disclosure. In an embodiment, the first semiconductor layer 31 may be n-GaN doped with n-type Si.

The second semiconductor layer 32 may be spaced apart from the first semiconductor layer 31 with the element active layer 33 interposed therebetween. The second semiconductor layer 32 may be doped with a second conductivity type dopant such as Mg, Zn, Ca, Se, Ba, or the like within the spirit and the scope of the disclosure. In an embodiment, the second semiconductor layer 32 may be p-GaN doped with p-type Mg.

The element active layer 33 may include a material having a single or multiple quantum well structure. As described above, the element active layer 33 may emit light by coupling of electron-hole pairs according to an electrical signal applied through the first semiconductor layer 31 and the second semiconductor layer 32.

In an embodiment, the element active layer 33 may have a structure in which semiconductor materials having large band gap energy and semiconductor materials having small band gap energy may be alternately stacked each other, and may include other group III to V semiconductor materials according to the wavelength band of the emitted light.

Light emitted from the element active layer 33 may be emitted not only to both end surfaces of the light emitting element ED in the length direction, but also to the outer peripheral surface (or outer surface or side surface) of the light emitting element. For example, the directionality of light emitted from the element active layer 33 is not limited to one direction or a direction.

The light emitting element ED may further include an element electrode layer 37 disposed on the second semiconductor layer 32. The element electrode layer 37 may be in contact with the second semiconductor layer 32. The element electrode layer 37 may be an ohmic contact electrode. However, the element electrode layer 37 is not limited thereto, and may be a Schottky contact electrode.

In case that both ends of the light emitting element ED are electrically connected to the contact electrodes 700 to apply an electrical signal to the first and second semiconductor layers 31 and 32, the element electrode layer 37 may be disposed between the second semiconductor layer 32 and the electrode to reduce resistance. The element electrode layer 37 may include at least one of aluminum (Al), titanium (Ti), indium (In), gold (Au), silver (Ag), indium tin oxide (ITO), indium zinc oxide (IZO), or indium tin zinc oxide (ITZO). The element electrode layer 37 may include an n-type or p-type doped semiconductor material.

The light emitting element ED may further include an element insulating film 38 surrounding the outer peripheral surfaces of the first semiconductor layer 31, the second semiconductor layer 32, and the element active layer 33 and/or the element electrode layer 37. The element insulating film 38 may be disposed to surround at least the outer surface of the element active layer 33 and may extend in one direction or in a direction in which the light emitting element ED extends. The element insulating film 38 may function to protect the members. Since the element insulating film 38 is made of materials having insulating properties, it is possible to prevent an electrical short circuit that may occur in case that the element active layer 33 directly contacts an electrode through which an electric signal is transmitted to the light emitting element ED. Further, since the element insulating film 38 protects the outer peripheral surfaces of the first and second semiconductor layers 31 and 32 including the element active layer 33, it is possible to prevent degradation in luminous efficiency.

Figure 11:
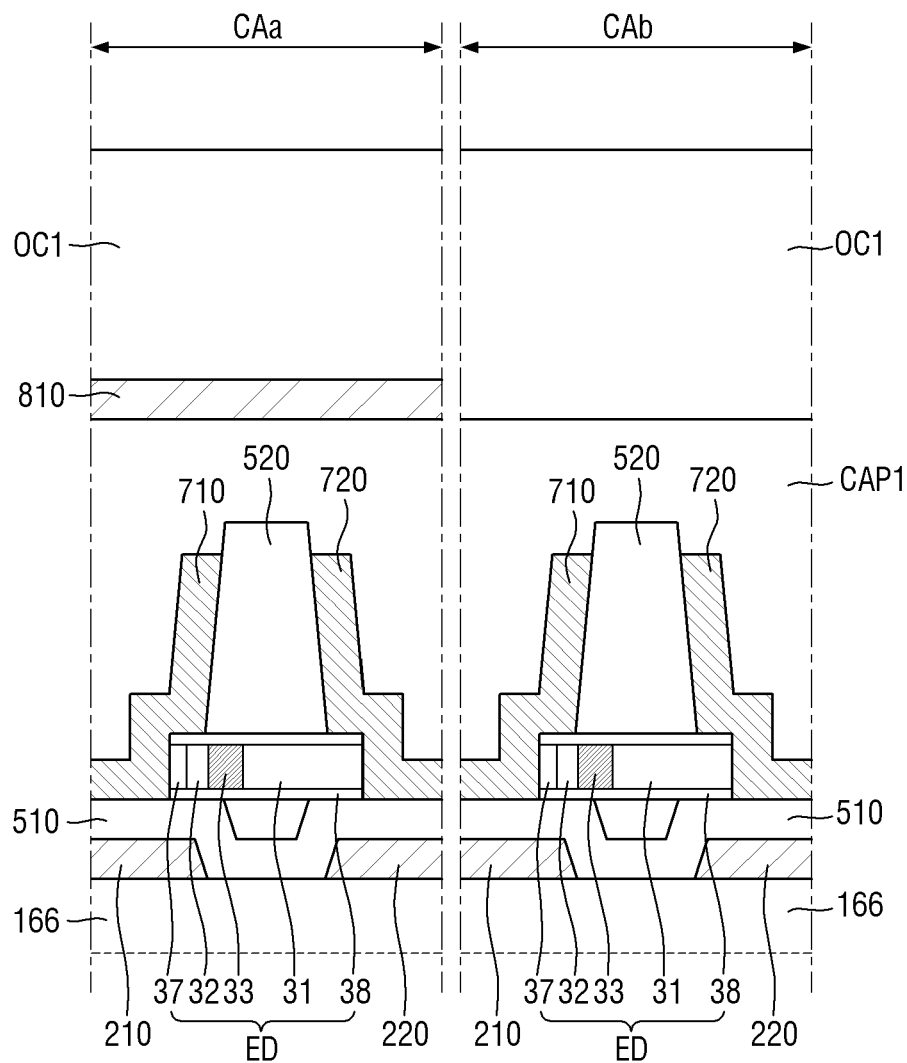
FIG. 11 is an enlarged schematic cross-sectional view illustrating an example of a light emitting element disposed in a rear alignment area and a front alignment area.

FIG. 11 is an enlarged schematic cross-sectional view illustrating an example of a light emitting element disposed in a rear alignment area and a front alignment area.

Referring to FIGS. 10 and 11, the light emitting element ED may extend in a direction parallel to one surface or a surface of the first substrate SUB1. The semiconductor layers included in the light emitting element ED may be sequentially arranged or disposed along the direction parallel to the top surface of the first substrate SUB1. For example, the first semiconductor layer 31, the element active layer 33, and the second semiconductor layer 32 of the light emitting element ED may be sequentially arranged or disposed in the direction parallel to the top surface of the first substrate SUB1.

For example, in the light emitting element ED, the first semiconductor layer 31, the element active layer 33, the second semiconductor layer 32, and the element electrode layer 37 may be sequentially formed in the direction parallel to the top surface of the substrate SUB in schematic cross-sectional view across both ends of the light emitting element ED.

The light emitting element ED may be disposed such that one end or an end thereof is located or disposed on the first electrode 210 and the other end or another end thereof is located or disposed on the second electrode 220. However, the disclosure is not limited thereto, and the light emitting element ED may be disposed such that one end or an end thereof is located or disposed on the second electrode 220 and the other end or another end thereof is located or disposed on the first electrode 210.

The second insulating layer 520 may be disposed on the light emitting element ED. The second insulating layer 520 may be disposed to surround the outer surface of the light emitting element ED. In the region where the light emitting element ED is disposed, the second insulating layer 520 may be disposed to surround the outer surface of the light emitting element ED, and in the region where the light emitting element ED is not disposed, the second insulating layer 520 may be disposed on the first insulating layer 510 exposed by the light emitting element ED.

The first contact electrode 710 may be in contact with one end or an end of the light emitting element ED exposed by the second insulating layer 520. For example, the first contact electrode 710 may be disposed to surround one end surface or an end surface of the light emitting element ED exposed by the second insulating layer 520. The first contact electrode 710 may be in contact with the element insulating film 38 and the element electrode layer 37 of the light emitting element ED.

The second contact electrode 720 may be in contact with the other end of the light emitting element ED exposed by the second insulating layer 520. For example, the second contact electrode 720 may be disposed to surround the other end surface of the light emitting element ED exposed by the second insulating layer 520. The second contact electrode 720 may be in contact with the element insulating film 38 and the first semiconductor layer 31 of the light emitting element ED.

The first contact electrode 710 and the second contact electrode 720 may be spaced apart from each other with the second insulating layer 520 interposed therebetween. The first contact electrode 710 and the second contact electrode 720 may expose at least a part of the top surface of the second insulating layer 520.

The first contact electrode 710 and the second contact electrode 720 may be formed on a same layer and may include a same material or a similar material. For example, the first contact electrode 710 and the second contact electrode 720 may be simultaneously formed in one mask process. Accordingly, an additional mask process for forming the first contact electrode 710 and the second contact electrode 720 is not required, so that the manufacturing process efficiency of the display device 10 can be improved.

The reflective layer 810 may cover or overlap the light emitting element ED disposed in the first alignment area CAa of the rear emission area EMAa from above. The reflective layer 810 may expose the light emitting element ED disposed in the second alignment area CAb of the front emission area EMAb. Since the reflective layer 810 covers or overlaps the light emitting element ED disposed in the first alignment area CAa from above and exposes the light emitting element ED disposed in the second alignment area CAb, light, which has been emitted from the light emitting element ED disposed in the first alignment area CAa and travels upward, may be reflected from the reflective layer 810 and travel downward, and light, which has been emitted from the light emitting element ED disposed in the second alignment area CAb and travels upward, may travel upward.

Figure 12:
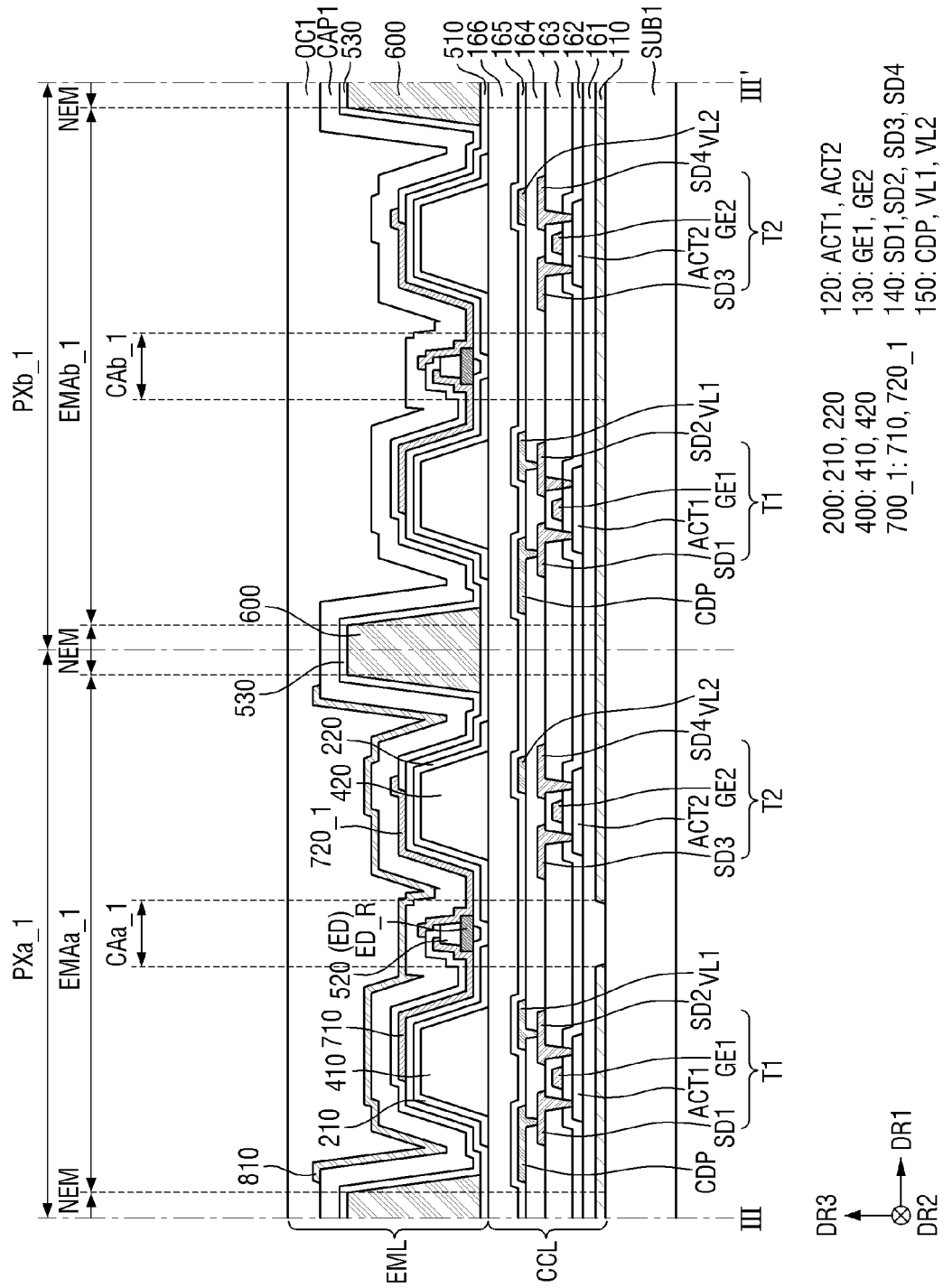
FIG. 12 is a schematic cross-sectional view illustrating an example taken along line III-III' of FIG. 5.

FIG. 12 is a schematic cross-sectional view illustrating an example taken along line III-III' of FIG. 5.

Referring to FIG. 12, the display device 1 according to an embodiment may be different from an embodiment of FIG. 7 in that the first contact electrode 710 and the second contact electrode 720 may be formed on different layers, and a third insulating layer 530 may be further included.

For example, the contact electrode 700 may include the first contact electrode 710 and the second contact electrode 720 formed on different layers.

The first contact electrode 710 may be disposed on the first electrode 210 and one end or an end of the light emitting element ED. The first contact electrode 710 may extend from one end or an end of the light emitting element ED toward the second insulating layer 520 to be also disposed on one sidewall or a sidewall of the second insulating layer 520 and the top surface of the second insulating layer 520. The first contact electrode 710 may be disposed on the top surface of the second insulating layer 520 while at least partially exposing the top surface of the second insulating layer 520.

The third insulating layer 530 may be disposed on the first contact electrode 710. The third insulating layer 530 may be disposed to completely cover or overlap the first contact electrode 710. The third insulating layer 530 may be disposed to completely cover or overlap one sidewall or a sidewall and the top surface or a top surface of the second insulating layer 520, but may not be disposed on the other sidewall of the second insulating layer 520. One end or an end of the third insulating layer 530 may be aligned with the other sidewall of the second insulating layer 520 in parallel.

The second contact electrode 720 may be disposed on the second electrode 220 and the other end of the light emitting element ED. The second contact electrode 720 may extend from the other end of the light emitting element ED toward the second insulating layer 520 to be also disposed on the other sidewall of the second insulating layer 520 and the top surface of the third insulating layer 530.

The first capping layer CAP1 may be disposed on the second contact electrode 720 and the third insulating layer 530. The reflective layer 810 may be disposed on the first capping layer CAP1 covering or overlapping the second contact electrode 720 and the third insulating layer 530.

In this embodiment, the first contact electrode 710 and the second contact electrode 720 are formed on the different layers with the third insulating layer 530 interposing therebetween. Accordingly, a step for manufacturing the display device 1 is added, which may decrease the manufacturing process efficiency of the display device 1, but the reliability of the display device 1 can be improved. For example, since the first contact electrode 710 and the second contact electrode 720 are formed in the different layers and the third insulating layer 530 is further interposed therebetween, it is possible to minimize a problem in which the first contact electrode 710 and the second contact electrode 720 are short-circuited during the manufacturing process of the display device 1.

Figure 13:
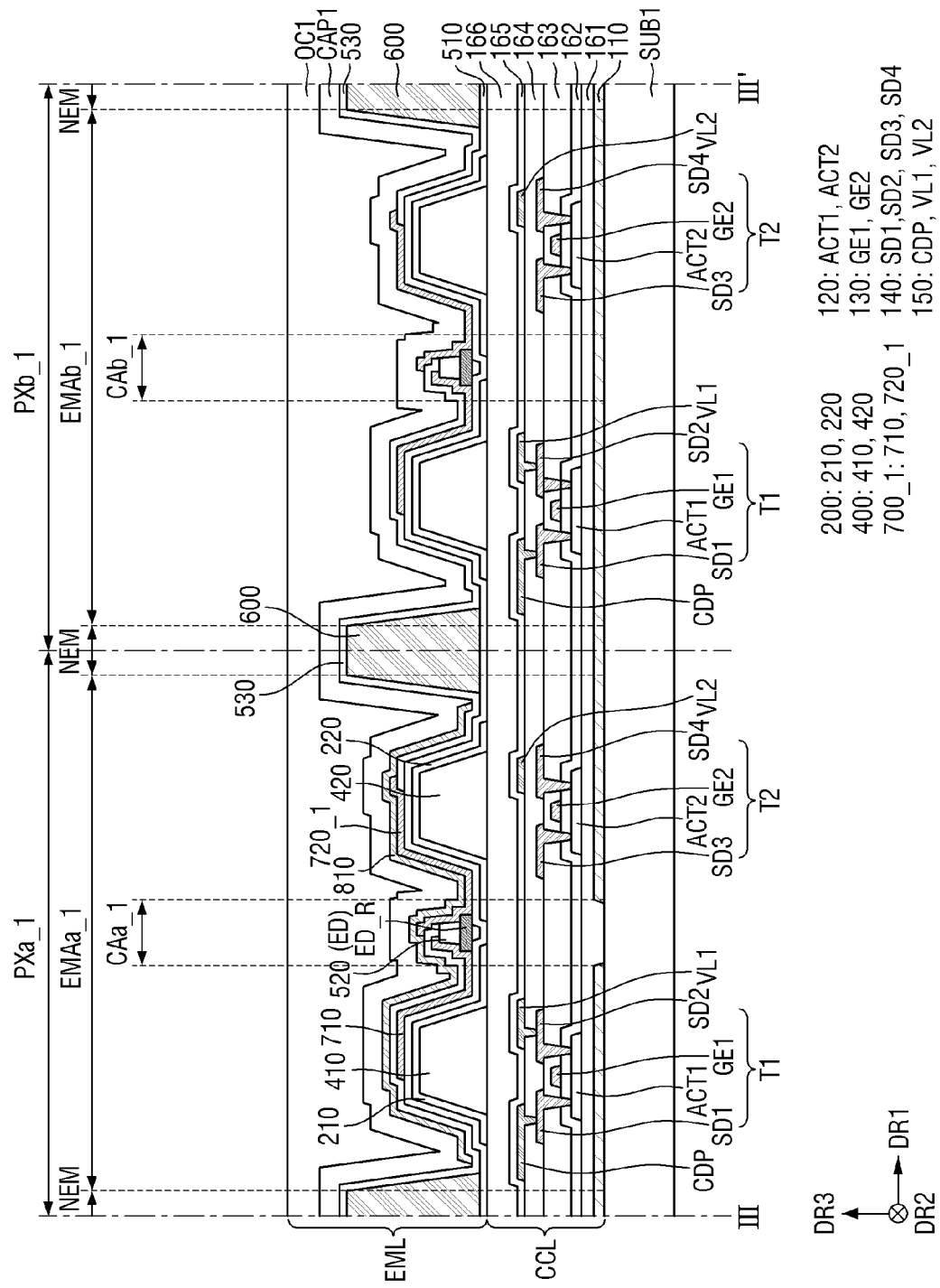
FIG. 13 is a schematic cross-sectional view illustrating an example taken along line III-III' of FIG. 5.

FIG. 13 is a schematic cross-sectional view illustrating an example taken along line III-III' of FIG. 5.

Referring to FIG. 13, the display device 1 according to an embodiment may be different from an embodiment of FIG. 12 in that the reflective layer 810 may be disposed on the third insulating layer 530 and the second contact electrode 720, and the first capping layer CAP1 may be disposed on the reflective layer 810.

For example, the reflective layer 810 may be disposed on the third insulating layer 530 and the second contact electrode 720, while being in contact with the third insulating layer 530 and the second contact electrode 720. The first capping layer CAP1 may be disposed on the reflective layer 810. For example, the reflective layer 810 may be interposed between the first capping layer CAP1, and the third insulating layer 530 and the second contact electrode 720 in the first rear emission area EMAa_1.

In this embodiment, the first contact electrode 710 and the second contact electrode 720 are formed on different layers, and the third insulating layer 530 is interposed therebetween to insulate them from each other, so that the reflective layer 810 may be disposed directly on the second contact electrode 720. Accordingly, since the separation distance between the light emitting element ED and the reflective layer 810 is decreased, it is possible to increase the reflective efficiency of reflecting light, which is emitted from the light emitting element ED and travels upward, in a downward direction.

Figure 14:
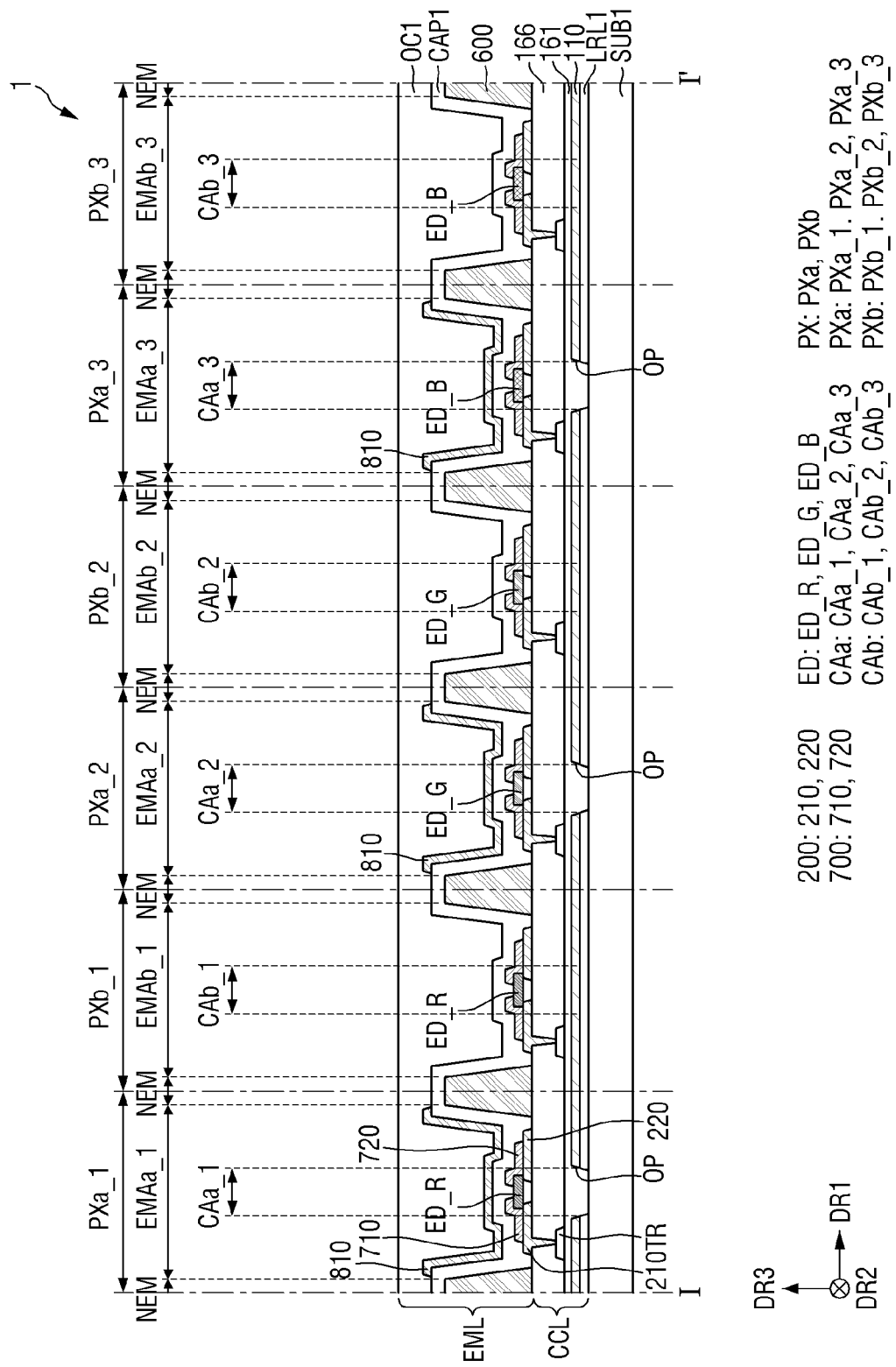
FIG. 14 is a schematic cross-sectional view illustrating another example taken along line I-I' of FIG. 2.

FIG. 14 is a schematic cross-sectional view illustrating another example taken along line I-I' of FIG. 2.

Referring to FIG. 14, the display device 1 according to an embodiment may be different from an embodiment of FIG. 3 in that a low reflective layer LRL1 may be further disposed under or below the lower metal layer 110.

In this embodiment, the lower metal layer 110 may include a material having high reflectivity. For example, the lower metal layer 110 may include a metal such as aluminum (Al) and silver (Ag). In this case, by further disposing the low reflective layer LRL1 between the lower metal layer 110 and the first substrate SUB1, it is possible to control light traveling toward the rear surface of the display device 1, among lights that have been emitted from the light emitting element layer EML and travel downward.

The low reflective layer LRL1 may include a light blocking material or a metal material having low reflectivity. For example, the low reflective layer LRL1 may include molybdenum (Mo), an alloy containing molybdenum (Mo), nickel (Ni), or an aluminum oxide (AlxOy).

Figure 15:
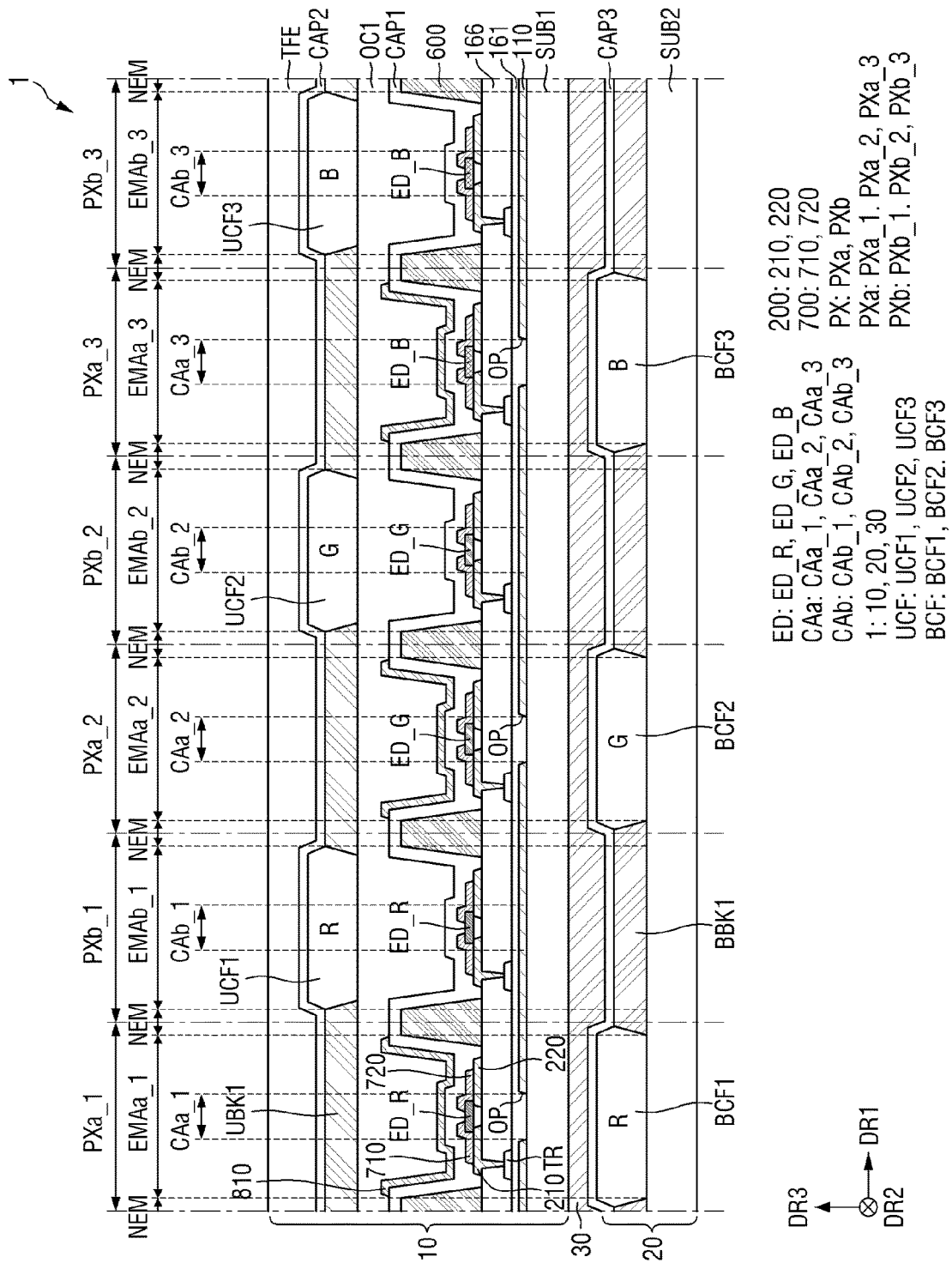
FIG. 15 is a schematic cross-sectional view illustrating another example taken along line I-I' of FIG. 2.

FIG. 15 is a schematic cross-sectional view illustrating another example taken along line I-I' of FIG. 2.

Referring to FIG. 15, the display device 1 according to the embodiment may be different from an embodiment of FIG. 3 in that it may include a first display substrate 10, a second display substrate 20, and a filling layer 30 disposed between the first display substrate 10 and the second display substrate 20.

For example, the first display substrate 10 may include the first substrate SUB1, the circuit element layer CCL, the light emitting element layer EML, an upper color filter layer UCF, and a first upper light blocking member UBK1.

The first display substrate 10 may be substantially the same as the above-described display device 1 of FIG. 3 except that it further may include the upper color filter layer UCF and the first upper light blocking member UBK1. Accordingly, a description of the first substrate SUB1, the circuit element layer CCL, and the light emitting element layer EML is substituted with the above description of the display device 1, and the upper color filter layer UCF of the first display substrate 10 will be described.

The upper light blocking member UBK1 may be disposed on the first planarization layer OC1. The upper light blocking member UBK1 may be disposed in the rear emission area EMAa and the non-emission area NEM on the first planarization layer OC1. For example, the first upper light blocking member UBK1 may be disposed in a grid shape surrounding the first to third front emission areas EMAb_1, EMAb_2, and EMAb_3.

The upper color filter layer UCF may be disposed on the first planarization layer OC1 exposed by the first upper light blocking member UBK1. The upper color filter layer UCF may be disposed in the front emission area EMAb.

The upper color filter layer UCF may include a first upper color filter UCF1, a second upper color filter UCF2, and a third upper color filter UCF3.

The first upper color filter UCF1, the second upper color filter UCF2, and the third upper color filter UCF3 may be disposed in the first front emission area EMAb_1 of the first front emission pixel PXb_1, the second front emission area EMAb_2 of the second front emission pixel PXb_2, and the third front emission area EMAb_3 of the third front emission pixel PXb_3, respectively. The first upper color filter UCF1, the second upper color filter UCF2, and the third upper color filter UCF3 may be surrounded by the first upper light blocking member UBK1.

The first to third upper color filters UCF1, UCF2, and UCF3 may include a colorant such as a dye or pigment that absorbs a wavelength other than a specific or given wavelength of the corresponding color.

The first upper color filter UCF1 may selectively allow the first color light (for example, red light) to pass therethrough, and block or absorb the second color light (for example, green light) and the third color light (for example, blue light). The second upper color filter UCF2 may selectively allow the second color light (for example, green light) to pass therethrough, and block or absorb the first color light (for example, red light) and the third color light (for example, blue light). The third upper color filter UCF3 may selectively allow the third color light (for example, blue light) to pass therethrough, and block or absorb the first color light (for example, red light) and the second color light (for example, green light). For example, the first upper color filter UCF1 may be a red color filter, the second upper color filter UCF2 may be a green color filter, and the third upper color filter UCF3 may be a blue color filter.

The first upper color filter UCF1 may selectively allow light of a specific or given wavelength band among the first color lights to pass therethrough, and block or absorb light of another wavelength band among the first color lights. Accordingly, it is possible to improve the color reproducibility of the first color light even in case that the first type light emitting element ED_R emitting the first color light is disposed in the first front emission area EMAb_1. Similarly, each of the second and third upper color filters UCF2 and UCF3 may selectively allow light of a specific or given wavelength band among the corresponding color lights to pass therethrough, and block or absorb light of another wavelength band among the corresponding color lights. Accordingly, it is possible to improve the color reproducibility of the display device 1 even in case that the second type light emitting element ED_G emitting the second color light is disposed in the second front emission area EMAb_2, and the third type light emitting element ED_B emitting the third color light is disposed in the third front emission area EMAb_3.

The first to third upper color filters UCF1, UCF2, and UCF3 may absorb some lights entering the front surface of the display device 1 from the outside, thereby reducing reflected light due to external light. Thus, the first to third upper color filters UCF1, UCF2, and UCF3 can prevent color distortion caused by the reflection of the external light.

A second capping layer CAP2 may be disposed on the upper color filter layer UCF and the first upper light blocking member UBK1 to cover or overlap them. The second capping layer CAP2 may serve to protect the upper color filter layer UCF and the first upper light blocking member UBK1.

An encapsulation layer TFE may be disposed on the second capping layer CAP2. The encapsulation layer TFE may include at least one inorganic layer to protect the member thereunder.

The second display substrate 20 may be disposed under or below the first display substrate 10. The second display substrate 20 may include a second substrate SUB2, a lower color filter layer BCF, and a first lower light blocking member BBK1.

The second substrate SUB2 may be a base substrate or a base member, and may be made of an insulating material such as a polymer resin. The second substrate SUB2 may be made of an insulating material such as glass, quartz, or polymer resin. The second substrate SUB2 may be a rigid substrate, or a flexible substrate including plastic such as polyimide (PI) capable of bending, folding, or rolling.

The lower color filter layer BCF and the first lower light blocking member BBK1 may be disposed on one surface or a surface of the second substrate SUB2 that faces the first substrate SUB1.

The first lower light blocking member BBK1 may be disposed on one surface or a surface of the second substrate SUB2. The first lower light blocking member BBK1 may be disposed on the one surface or a surface of the second substrate SUB2 in the front emission area EMAb and the non-emission area NEM. For example, the first lower light blocking member BBK1 may be disposed in a grid shape surrounding the first to third rear emission areas EMAa_1, EMAa_2, and EMAa_3.

The lower color filter layer BCF may be disposed on the one surface or a surface of the second substrate SUB2 exposed by the first lower light blocking member BBK1. The lower color filter layer BCF may be disposed in the rear emission area EMAa.

The lower color filter layer BCF may include a first lower color filter BCF1, a second lower color filter BCF2, and a third lower color filter BCF3.

The first lower color filter BCF1, the second lower color filter BCF2, and the third lower color filter BCF3 may be disposed in the first rear emission area EMAa_1 of the first rear emission pixel PXa_1, the second rear emission area EMAa_2 of the second rear emission pixel PXa_2, and the third rear emission area EMAa_3 of the third rear emission pixel PXa_3, respectively. The first lower color filter BCF1, the second lower color filter BCF2, and the third lower color filter BCF3 may be surrounded by the first lower light blocking member BBK1.

The first lower color filter BCF1 may be a red color filter, the second lower color filter BCF2 may be a green color filter, and the third lower color filter BCF3 may be a blue color filter.

A third capping layer CAP3 may be disposed on the lower color filter layer BCF and the first lower light blocking member BBK1 to cover or overlap them. The third capping layer CAP3 may serve to protect the lower color filter layer BCF and the first lower light blocking member BBK1.

The filling layer 30 may be disposed between the first display substrate 10 and the second display substrate 20. The filling layer 30 may fill a space between the first display substrate 10 and the second display substrate 20, and may serve to bond them to each other. The filling layer 30 may be disposed between the first substrate SUB1 of the first display substrate 10 and the third capping layer CAP3 of the second display substrate 20. The filling layer 30 may be formed of an Si-based organic material, an epoxy-based organic material, or the like, but is not limited thereto.

Figure 16:
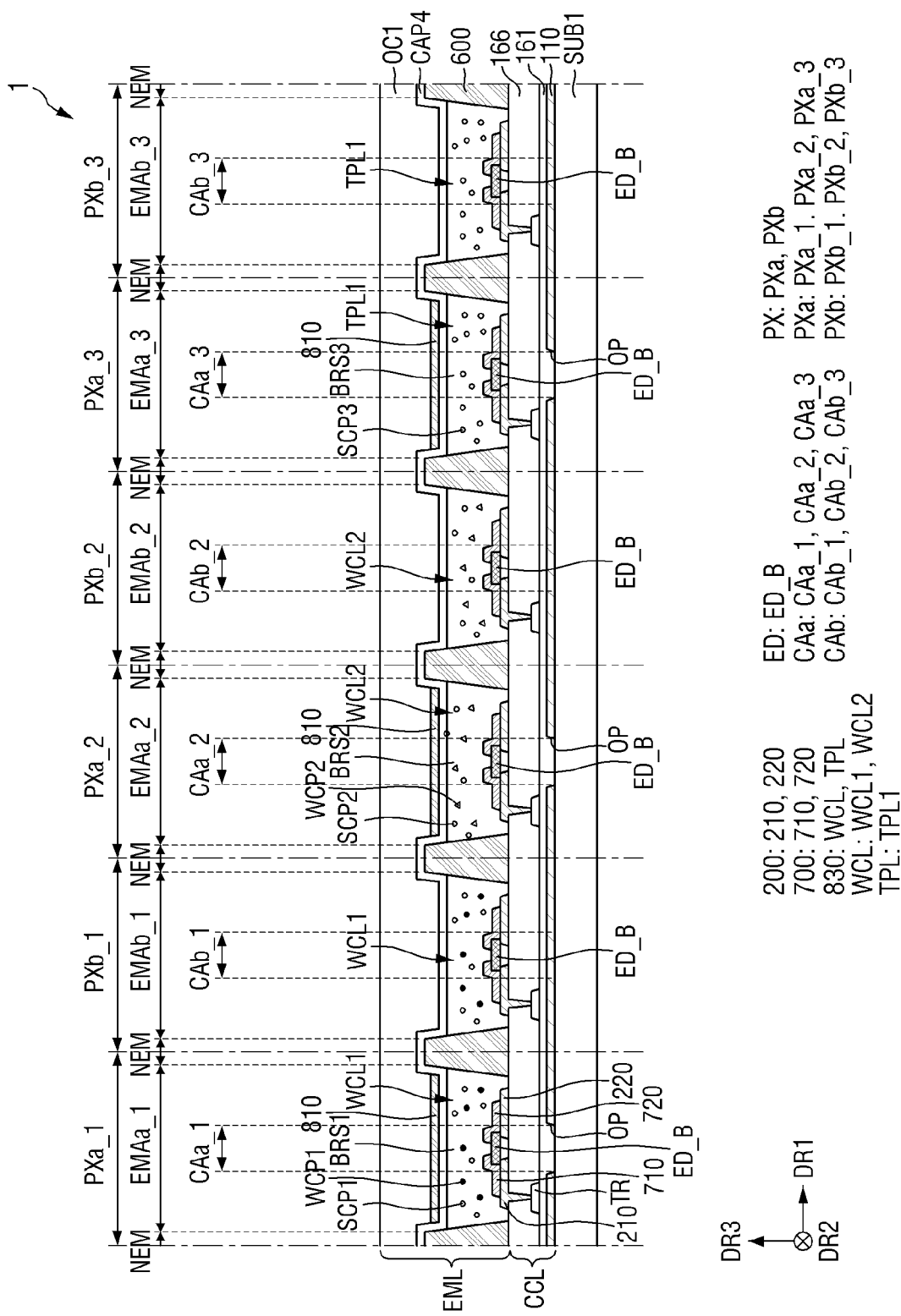
FIG. 16 is a schematic cross-sectional view illustrating another example taken along line I-I' of FIG. 2.

FIG. 16 is a schematic cross-sectional view illustrating another example taken along line I-I' of FIG. 2.

Referring to FIG. 16, the display device 1 according to the embodiment may be different from an embodiment of FIG. 3 in that a wavelength control layer 830 may be disposed in a space partitioned by the first bank 600, and the first capping layer CAP1 may be disposed on the wavelength control layer 830.

For example, the wavelength control layer 830 may include a wavelength conversion layer WCL for converting a wavelength of light emitted from the light emitting element ED and a light transmission layer TPL for allowing light emitted from the light emitting element ED to pass therethrough while maintaining the wavelength thereof.

The wavelength conversion layer WCL and the light transmission layer TPL may be separately disposed for each pixel PX. For example, the wavelength conversion layer WCL and the light transmission layer TPL may be disposed in each of the emission areas of the first to third rear emission pixels PXa_1, PXa_2, and PXa_3 and the first to third front emission pixels PXb_1, PXb_2, and PXb_3. The wavelength conversion layer WCL and the light transmission layer TPL, which are disposed adjacent to each other, may be spaced apart from each other by the first bank 600.

The wavelength conversion layer WCL may be disposed in a pixel at which light emitted from the light emitting element ED may include light having a different color from the color of the corresponding pixel, and thus the wavelength of the incident light needs to be converted. The light transmission layer TPL may be disposed in a pixel in which light emitted from the light emitting element ED has a same color as the color of the corresponding pixel. In the illustrated embodiment, the third type light emitting element ED_B may be disposed in each of the first to third rear emission pixels PXa_1, PXa_2, and PXa_3 and the first to third front emission pixels PXb_1, PXb_2, and PXb_3. Accordingly, the wavelength conversion layer WCL may be disposed in each of the first and second rear emission pixels PXa_1 and PXa_2 and the first and second front emission pixels PXb_1 and PXb_2, and the light transmission layer TPL may be disposed in each of the third rear emission pixel PXa_3 and the third front emission pixel PXb_3.

The wavelength conversion layer WCL may include a first wavelength conversion pattern WCL1 disposed in each of the first rear emission pixel PXa_1 and the first front emission pixel PXb_1, and a second wavelength conversion pattern WCL2 disposed in each of the second rear emission pixel PXa_2 and the second front emission pixel PXb_2.

The first wavelength conversion pattern WCL1 may be disposed in each of the first rear emission area EMAa_1 and the first front emission area EMAb_1 that are partitioned by the first bank 600. The first wavelength conversion pattern WCL1 may convert light, which is incident from the third type light emitting element ED_B disposed in each of the first rear emission area EMAa_1 and the first front emission area EMAb_1, into first color light.

The first wavelength conversion pattern WCL1 may include a first base resin BRS1 and a first wavelength conversion material WCP1 dispersed in the first base resin BRS1. The first wavelength conversion pattern WCL1 may further include a first scatterer SCP1 dispersed in the first base resin BRS1.

The second wavelength conversion pattern WCL2 may be disposed in each of the second rear emission area EMAa_2 and the second front emission area EMAb_2 that are partitioned by the first bank 600. The second wavelength conversion pattern WCL2 may convert light, which is incident from the third type light emitting element ED_B disposed in the second rear emission area EMAa_2 and the second front emission area EMAb_2, into second color light.

The second wavelength conversion pattern WCL2 may include a second base resin BRS2 and a second wavelength conversion material WCP2 dispersed in the second base resin BRS2. The second wavelength conversion pattern WCL2 may further include a second scatterer SCP2 dispersed in the second base resin BRS2.

The light transmission layer TPL may include a first light transmission pattern TPL1 disposed in each of the third rear emission pixel PXa_3 and the third front emission pixel PXb_3.

The first light transmission pattern TPL1 may be disposed in each of the third rear emission area EMAa_3 and the third front emission area EMAb_3 that are partitioned by the first bank 600. The first light transmission pattern TPL1 may allow light, which is incident from the third type light emitting element ED_B disposed in each of the third rear emission area EMAa_3 and the third front emission area EMAb_3, to be emitted while maintaining the wavelength thereof.

The first light transmission pattern TPL1 may include a third base resin BRS3. The first light transmission pattern TPL1 may further include a third scatterer SCP3 dispersed in the third base resin BRS3.

The first to third base resins BRS1, BRS2, and BRS3 may include a light transmitting organic material. For example, the first to third base resins BRS1, BRS2, and BRS3 may include an epoxy resin, an acrylic resin, a cardo resin, an imide resin, or the like within the spirit and the scope of the disclosure. The first to third base resins BRS1, BRS2 and BRS3 may be formed of a same material or a similar material, but the disclosure is not limited thereto.

The first to third scatterers SCP1, SCP2 and SCP3 may have a refractive index different from that of the first to third base resins BRS1, BRS2, and BRS3. The first to third scatterers SCP1, SCP2, and SCP3 may include metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like within the spirit and the scope of the disclosure. Examples of a material of the organic particles may include acrylic resin and urethane resin, and the like within the spirit and the scope of the disclosure. The first to third scatterers SCP1, SCP2, and SCP3 may all be formed of a same material or a similar material, but are not limited thereto.

The first wavelength conversion material WCP1 may be a material that converts the third color light or the second color light into the first color light, and the second wavelength conversion material WCP2 may be a material that converts the third color light into the second color light. For example, the first wavelength conversion material WCP1 may be a material that converts blue light into red light or green light into red light. The second wavelength conversion material WCP2 may be a material that converts blue light into green light. The first wavelength conversion material WCP1 and the second wavelength conversion material WCP2 may be quantum dots (QDs), quantum rods, a fluorescent material, or a phosphorescent material. Examples of the quantum dot may include group IV nanocrystal, group II-VI compound nanocrystal, group III-V compound nanocrystal, group IV-VI nanocrystal, and a combination thereof.

The QD may include a core and a shell that overcoats the core. The core may be at least one of, for example, CdS, CdSe, CdTe, ZnS, ZnSe, ZnTe, GaN, GaP, GaAs, GaSb, AlN, AlP, AlAs, AlSb, InP, InAs, InSb, SiC, Ca, Se, In, P, Fe, Pt, Ni, Co, Al, Ag, Au, Cu, FePt, $Fe_2O_3$, $Fe_3O_4$, Si and Ge, but is not limited thereto. The shell may include at least one of, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe and PbTe, but is not limited thereto.

The first capping layer CAP1 may be disposed on the wavelength control layer 830. The wavelength control layer 830 may be protected by sealing the top surface of the first capping layer CAP1. The reflective layer 810 may be disposed on the first capping layer CAP1 and the wavelength control layer 830.

Figure 17:
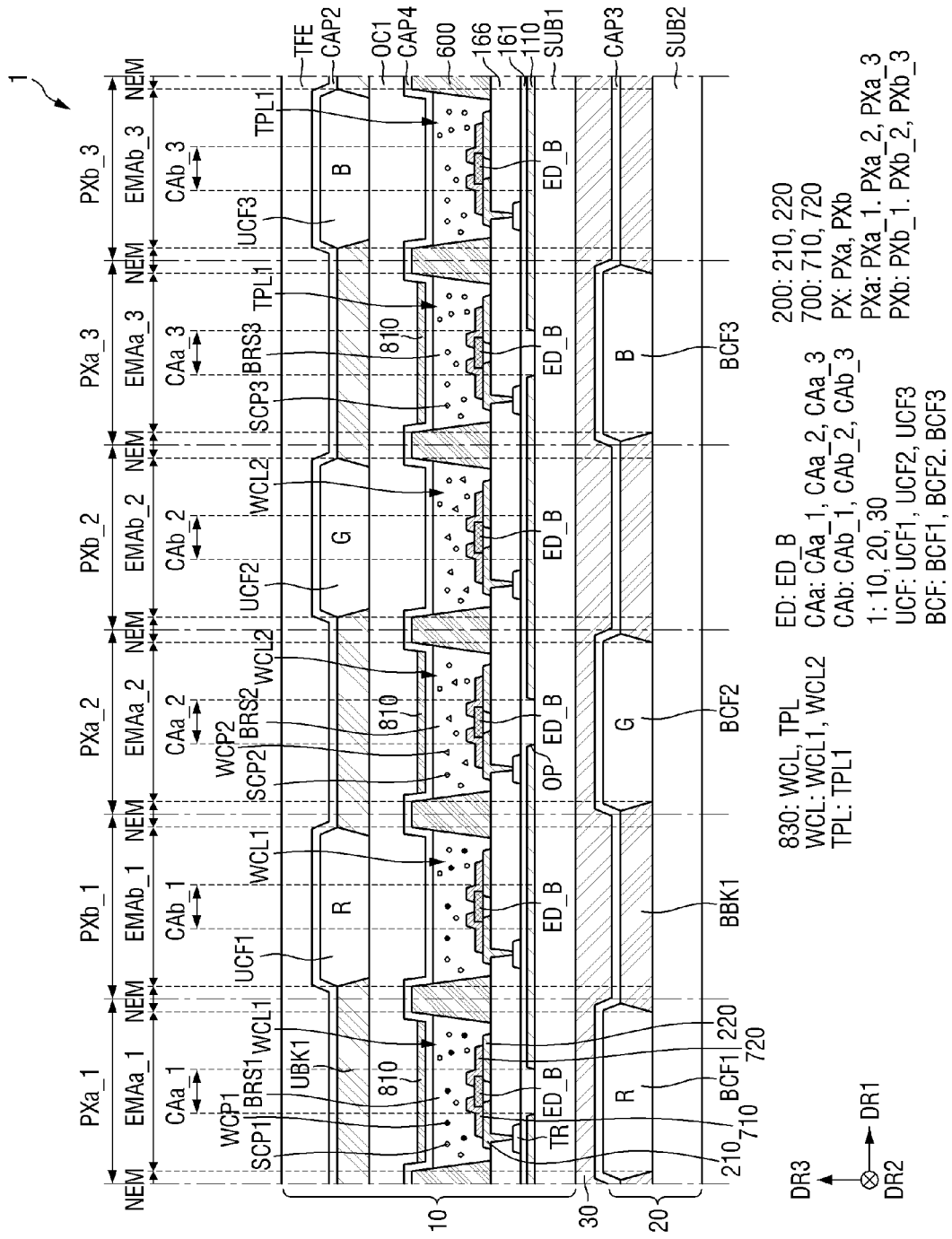
FIG. 17 is a schematic cross-sectional view illustrating another example taken along line I-I' of FIG. 2.

FIG. 17 is a schematic cross-sectional view illustrating another example taken along line I-I' of FIG. 2.

Referring to FIG. 17, the display device 1 according to an embodiment may be different from an embodiment of FIG. 16 in that it may include the first display substrate 10 having the wavelength control layer 830 and the upper color filter layer UCF, the second display substrate 20 having the lower color filter layer BCF, and the filling layer 30.

For example, the first display substrate 10 may be substantially the same as the display device 1 of FIG. 16 described above, except that it further may include the upper color filter layer UCF and the first upper light blocking member UBK1. The upper color filter layer UCF of the first display substrate 10 may be the same as that of the above-described first display substrate 10 of FIG. 15. For example, the upper color filter layer UCF may include the first to third upper color filters UCF1, UCF2, and UCF3. The first upper color filter UCF1 may overlap the first wavelength conversion pattern WCP1 disposed in the first front emission area EMAb_1 in the third direction DR3, the second upper color filter UCF2 may overlap the second wavelength conversion pattern WCP2 disposed in the second front emission area EMAb_2 in the third direction DR3, and the third upper color filter UCF3 may overlap the first light transmission pattern TPL1 disposed in the third front emission area EMAb_3 in the third direction DR3.

The lower color filter BCF of the second display substrate 20 may include the first to third lower color filters BCF1, BCF2, and BCF3. The first lower color filter BCF1 may overlap the first wavelength conversion pattern WCP1 disposed in the first rear emission area EMAa_1 in the third direction DR3, the second lower color filter BCF2 may overlap the second wavelength conversion pattern WCP2 disposed in the second rear emission area EMAa_2 in the third direction DR3, and the third lower color filter BCF3 may overlap the first light transmission pattern TPL1 disposed in the third rear emission area EMAa_3 in the third direction DR3.

Figure 18:
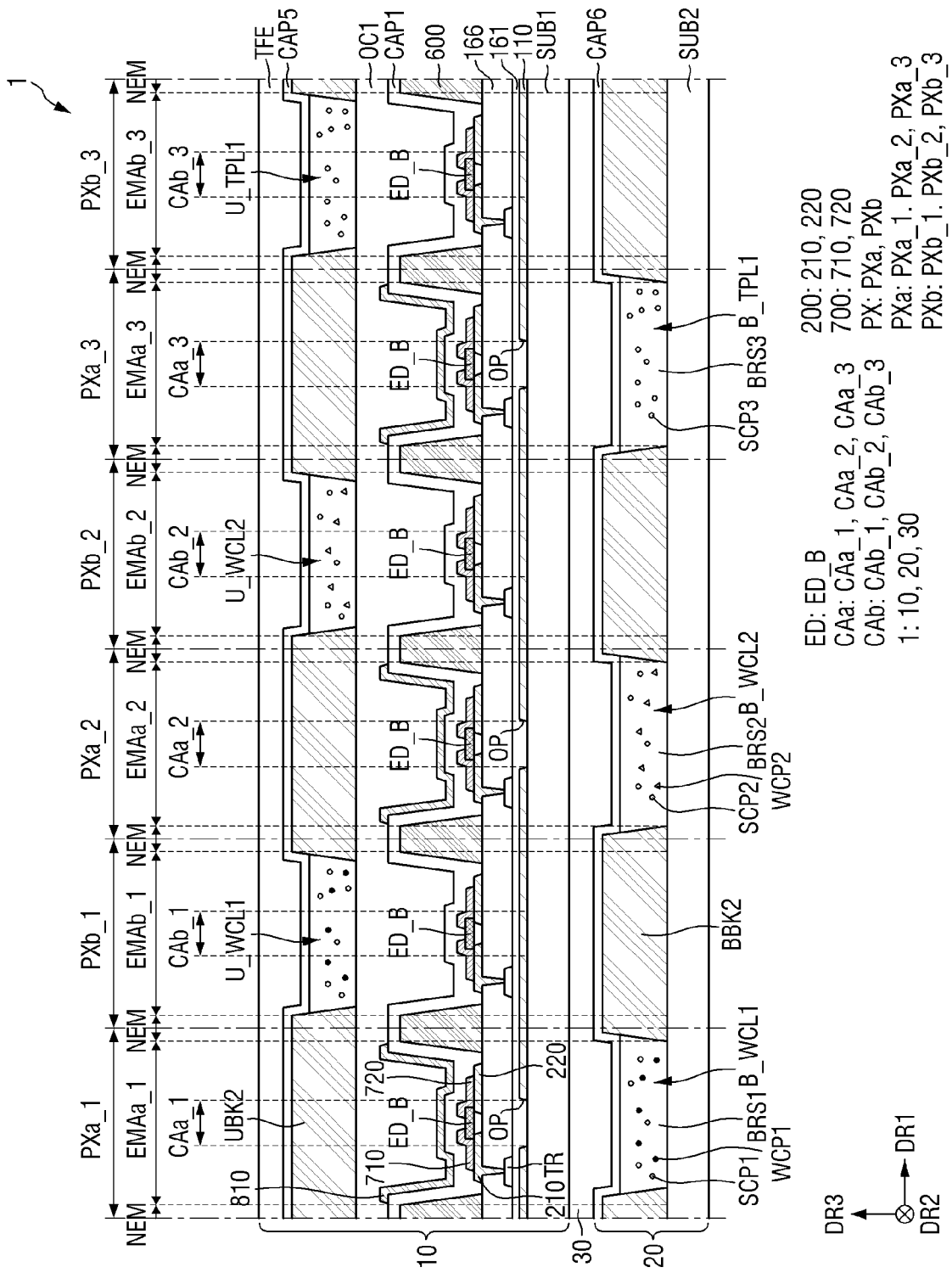
FIG. 18 is a schematic cross-sectional view illustrating another example taken along line I-I' of FIG. 2.

FIG. 18 is a schematic cross-sectional view illustrating another example taken along line I-I' of FIG. 2.

Referring to FIG. 18, the display device 1 according to an embodiment may be different from an embodiment of FIG. 3 in that it may include the first display substrate 10 having first and second upper wavelength conversion patterns U_WCL1 and U_WCL2, a first upper light transmission pattern U_TPL1, and a second upper light blocking member UBK2 disposed on the first planarization layer OC1, the second display substrate 20 having first and second lower wavelength conversion patterns B_WCL1 and B_WCL2, a first lower light transmission pattern B_TPL1, and a second lower light blocking member BBK2, and the filling layer 30.

For example, the first display substrate 10 may be substantially the same as that of the display device 1 of FIG. 3 described above except that it may include the first and second upper wavelength conversion patterns U_WCL1 and U_WCL2, the first upper light transmission pattern U_TPL1, and the second upper light blocking member UBK2 disposed on the first planarization layer OC1.

The second upper light blocking member UBK2 may be disposed on the first planarization layer OC1. The second upper light blocking member UBK2 may be disposed in the rear emission area EMAa and the non-emission area NEM on the first planarization layer OC1. For example, the second upper light blocking member UBK2 may be disposed in a grid shape surrounding the first to third front emission areas EMAb_1, EMAb_2, and EMAb_3.

The first upper wavelength conversion pattern U_WCL1 may be disposed in the first front emission area EMAb_1 of the first front emission pixel PXb_1, the second upper wavelength conversion pattern U_WCL2 may be disposed in the second front emission area EMAb_2 of the second front emission pixel PXb_2, and the first upper light transmission pattern U_TPL1 may be disposed in the third front emission area EMAb_3 of the third front emission pixel PXb_3. The first upper wavelength conversion pattern U_WCL1, the second upper wavelength conversion pattern U_WCL2, and the first upper light transmission pattern U_TPL1 may be surrounded by the second upper light blocking member UBK2.

A fifth capping layer CAP5 may be further disposed on the first and second upper wavelength conversion patterns U_WCL1 and U_WCL2, the first upper light transmission pattern U_TPL1, and the second upper light blocking member UBK2. The fifth capping layer CAP5 may cover or overlap the first and second upper wavelength conversion patterns U_WCL1 and U_WCL2, the first upper light transmission pattern U_TPL1, and the second upper light blocking member UBK2 to protect them.

The second display substrate 20 may include the second substrate SUB2, the first and second lower wavelength conversion patterns B_WCL1 and B_WCL2, the first lower light transmission pattern B_TPL1, and the second lower light blocking member BBK2.

The first and second lower wavelength conversion patterns B_WCL1 and B_WCL2, and the first lower light transmission pattern B_TPL1 may be disposed on one surface or a surface of the second substrate SUB2 that faces the first substrate SUB1.

The first lower wavelength conversion pattern B_WCL1 may be disposed in the first rear emission area EMAa_1 of the first rear emission pixel PXa_1, the second lower wavelength conversion pattern B_WCL2 may be disposed in the second rear emission area EMAa_2 of the second rear emission pixel PXa_2, and the first lower light transmission pattern B_TPL1 may be disposed in the third rear emission area EMAa_3 of the third rear emission pixel PXa_3. The first lower wavelength conversion pattern B_WCL1, the second lower wavelength conversion pattern B_WCL2, and the first lower light transmission pattern B_TPL1 may be surrounded by the second lower light blocking member BBK2.

A sixth capping layer CAP6 may be further disposed on the first and second lower wavelength conversion patterns B_WCL1 and B_WCL2, the first lower light transmission pattern B_TPL1, and the second lower light blocking member BBK2. The sixth capping layer CAP6 may cover or overlap the first and second lower wavelength conversion patterns B_WCL1 and B_WCL2, the first lower light transmission pattern B_TPL1, and the second lower light blocking member BBK2 to protect them.

Figure 19:
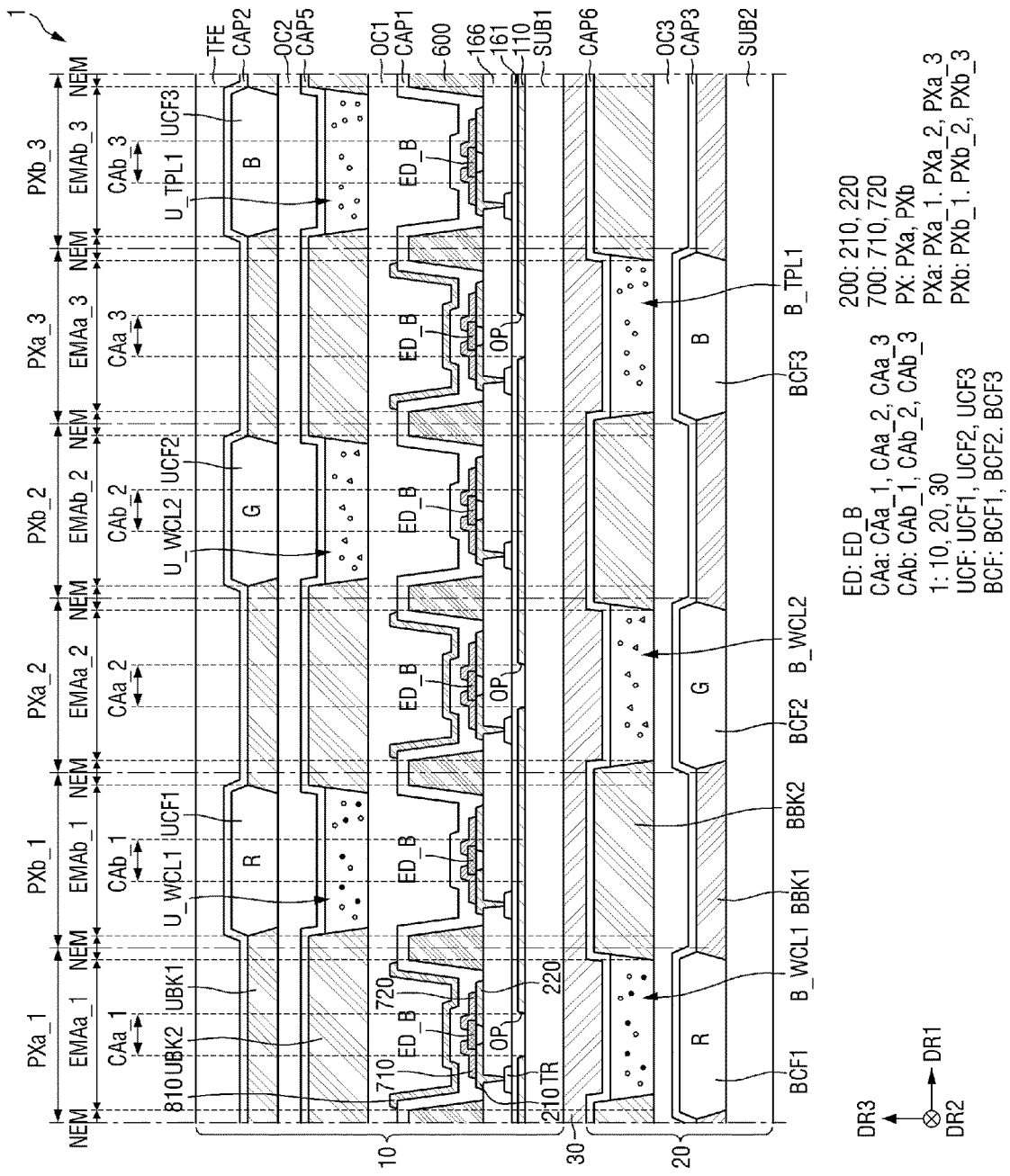
FIG. 19 is a schematic cross-sectional view illustrating another example taken along line I-I' of FIG. 2.

FIG. 19 is a schematic cross-sectional view illustrating another example taken along line I-I' of FIG. 2.

Referring to FIG. 19, the first display substrate 10 may further include a second planarization layer OC2 disposed on the first and second upper wavelength conversion patterns U_WCL1 and U_WCL2, the first upper light transmission pattern U_TPL1, and the second upper light blocking member UBK2, and the upper color filter layer UCF and the first upper light blocking member UBK1 disposed on the second planarization layer OC2.

Further, the second display substrate 20 may further include the lower color filter layer BCF and the first lower light blocking member BBK1 between the second substrate SUB2 and the first and second lower wavelength conversion patterns B_WCL1 and B_WCL2, the first lower light transmission pattern U_TPL1, and the second lower light blocking member BBK2.

Figure 20:
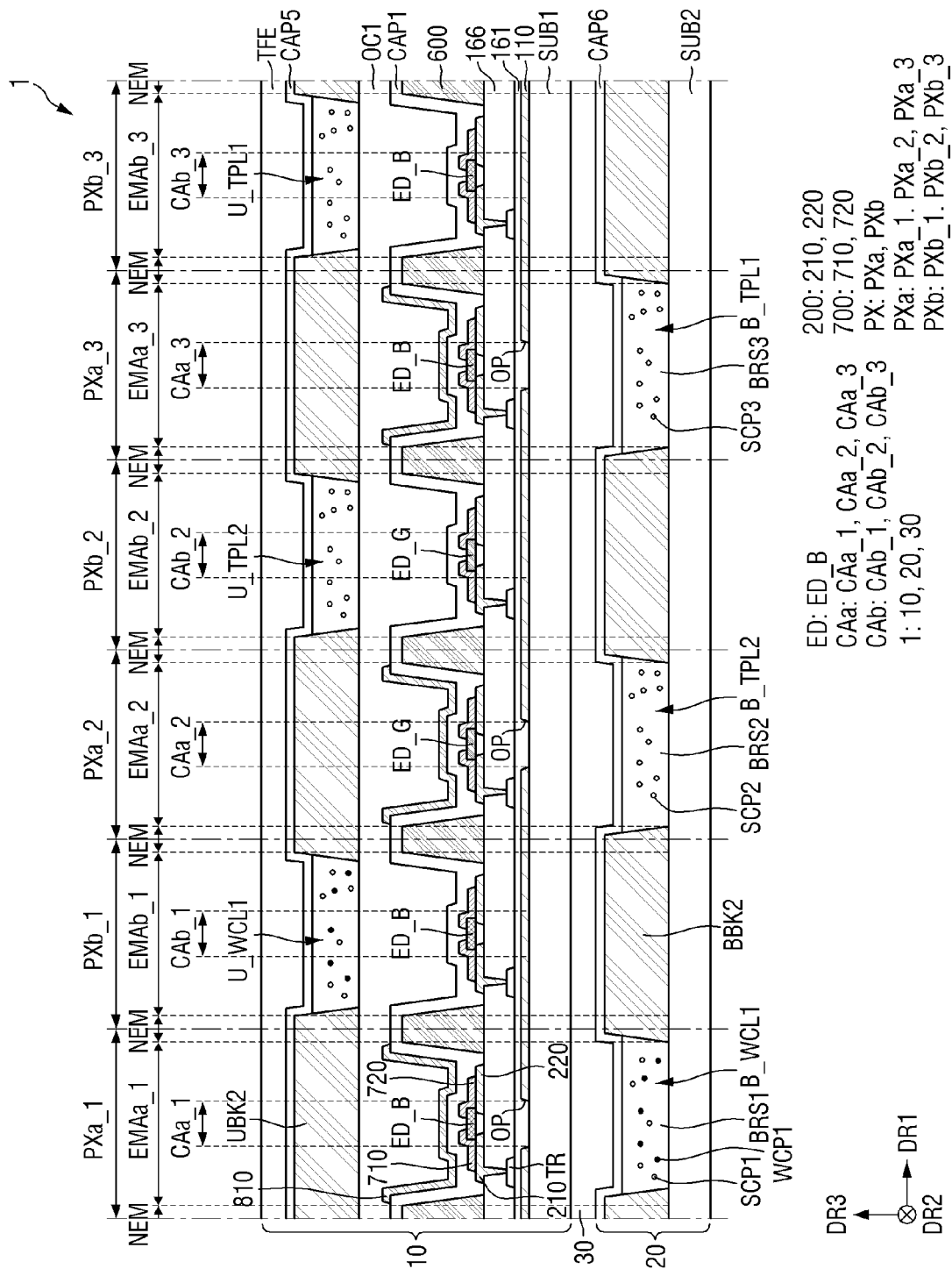
FIG. 20 is a schematic cross-sectional view illustrating another example taken along line I-I' of FIG. 2.

FIG. 20 is a schematic cross-sectional view illustrating another example taken along line I-I' of FIG. 2.

Referring to FIG. 20, the display device 1 according to an embodiment may be different from an embodiment of FIG. 18 in that the second type light emitting element ED_G may be disposed in each of the second rear emission pixel PXa_2 and the second front emission pixel PXb_2, a second upper light transmission pattern U_TPL2 may be disposed in the second front emission area EMAb_2 of the second front emission pixel PXb_2 of the first display substrate 10, and a second lower light transmission pattern B_TPL2 may be disposed in the second rear emission area EMAa_2 of the second rear emission pixel PXa_2 of the second display substrate 20.

Figure 21:
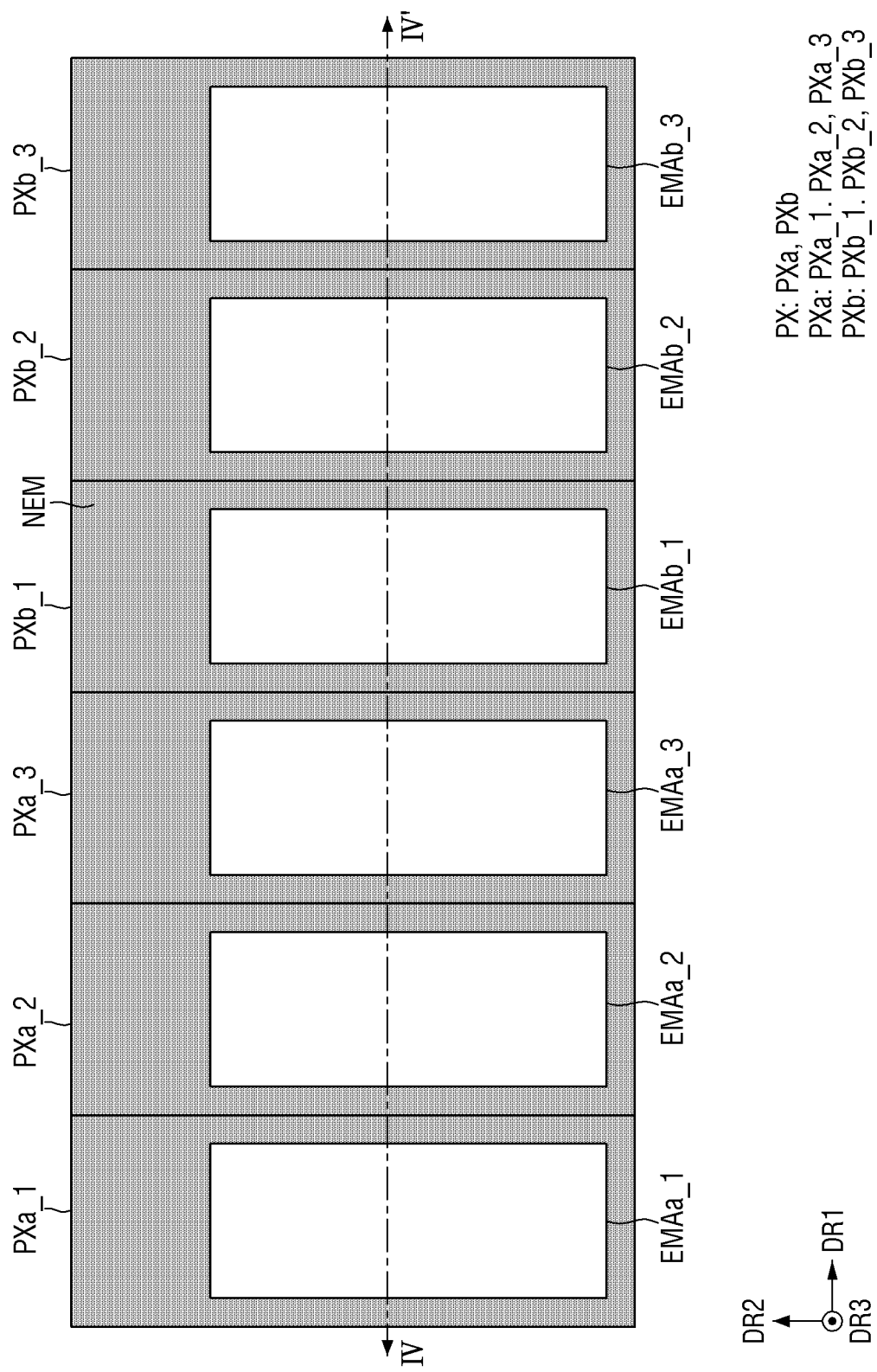
FIG. 21 is a schematic plan view showing a pixel arrangement of a display device according to an embodiment.
Figure 22:
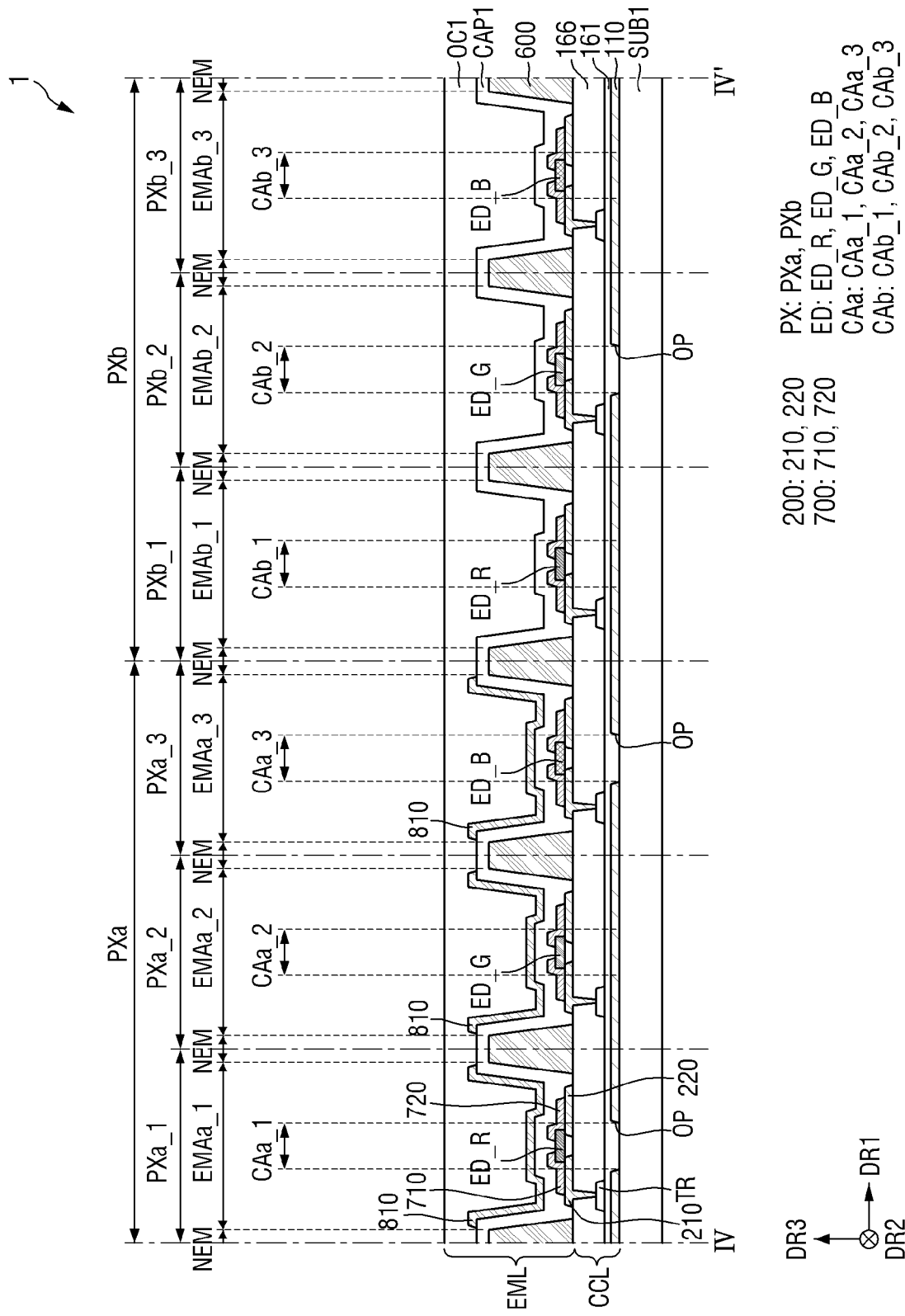
FIG. 22 is a schematic cross-sectional view illustrating an example taken along line IV-IV' of FIG. 21.

FIG. 21 is a schematic plan view showing a pixel arrangement of a display device according to an embodiment. FIG. 22 is a schematic cross-sectional view illustrating an example taken along line IV-IV' of FIG. 21.

Referring to FIGS. 21 and 22, the display device 1 according to an embodiment may be different from an embodiment of FIGS. 2 and 3 in that the first to third rear emission pixels PXa_1, PXa_2, and PXa_3 of the rear emission pixel PXa and the first to third front emission pixels PXb_1, PXb_2, and PXb_3 of the front emission pixel PXb may not be alternately disposed.

For example, the first to third rear emission pixels PXa_1, PXa_2, and PXa_3 of the rear emission pixel PXa may be sequentially disposed in the first direction DR1, and the first to third front emission pixels PXb_1, PXb_2, and PXb_3 of the front emission pixel PXb may be sequentially disposed in the first direction DR1.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. A display device comprising:
    a lower metal layer disposed on a surface of a substrate and including a first opening overlapping a rear emission pixel in a plan view;
    a first electrode and a second electrode disposed in each of the rear emission pixel and a front emission pixel, the first electrode and the second electrode being spaced apart from each other on the lower metal layer;
    first light emitting elements disposed between the first electrode and the second electrode disposed in the rear emission pixel;
    second light emitting elements disposed between the first electrode and the second electrode disposed in the front emission pixel; and
    a reflective layer disposed on the first light emitting elements and overlapping the rear emission pixel in a plan view,
    wherein the reflective layer overlaps at least one of the first light emitting elements in a plan view.

2. The display device of claim 1, wherein the first opening of the lower metal layer overlaps the first light emitting elements in a plan view.

3. The display device of claim 2, wherein the lower metal layer overlaps the second light emitting elements in a plan view.

4. The display device of claim 1, wherein the reflective layer exposes the second light emitting elements.

5. The display device of claim 1, further comprising:
    a buffer layer disposed on the lower metal layer; and
    a transistor disposed on the buffer layer, the transistor disposed in each of the rear emission pixel and the front emission pixel,
    wherein the transistor does not overlap the first opening of the lower metal layer in a plan view.

6. The display device of claim 5, wherein the transistor does not overlap the first light emitting elements in a plan view.

7. The display device of claim 1, further comprising:
    a first bank disposed along a boundary between the rear emission pixel and the front emission pixel, wherein
    the first bank defines an emission area and a non-emission area,
    the emission area includes:
        a rear emission area of the rear emission pixel; and
        a front emission area of the front emission pixel,
    the first light emitting elements are disposed in the rear emission area, and
    the second light emitting elements are disposed in the front emission area.

8. The display device of claim 7, further comprising:
    a first wavelength conversion pattern disposed on the second light emitting elements and disposed in the front emission area.

9. The display device of claim 8, further comprising:
    a second wavelength conversion pattern disposed on the first light emitting elements and disposed in the rear emission area, wherein the first wavelength conversion pattern and the second wavelength conversion pattern are disposed in a space partitioned by the first bank, and the reflective layer is disposed on the second wavelength conversion pattern.

10. The display device of claim 8, further comprising:
a light blocking member disposed in the non-emission area and the rear emission area, wherein
the light blocking member is disposed on the reflective layer, and
the light blocking member surrounds the first wavelength conversion pattern.

11. The display device of claim 1, further comprising:
a low reflective layer disposed between the lower metal layer and the substrate,
wherein the low reflective layer includes a second opening overlapping the first opening of the lower metal layer in a plan view.

12. A display device comprising:
a first substrate including:
a first emission area;
a second emission area; and
a non-emission area surrounding the first emission area and the second emission area;
a lower metal layer disposed on a surface of the first substrate;
a buffer layer disposed on the lower metal layer;
a semiconductor layer disposed on the buffer layer, the semiconductor layer including an active pattern of a transistor;
a gate insulating layer disposed on the semiconductor layer;
a first conductive layer disposed on the gate insulating layer, the first conductive layer including a gate electrode of the transistor;
an interlayer insulating layer disposed on the first conductive layer;
a second conductive layer disposed on the interlayer insulating layer, the second conductive layer including a source electrode and a drain electrode of the transistor;
a via layer disposed on the second conductive layer;
a first electrode and a second electrode disposed in each of the first emission area and the second emission area, the first electrode and the second electrode being spaced apart from each other on the via layer;
a light emitting element disposed between the first electrode and the second electrode of each of the first emission area and the second emission area; and
a reflective layer overlapping the first emission area in a plan view, wherein
the lower metal layer includes an opening overlapping the first emission area in a plan view, and
the opening of the lower metal layer does not overlap the first conductive layer, the second conductive layer, and the semiconductor layer in a plan view.

13. The display device of claim 12, wherein the reflective layer completely overlaps a first light emitting element disposed in the first emission area in a plan view.

14. The display device of claim 13, wherein the opening of the lower metal layer overlaps the first light emitting element disposed in the first emission area in a plan view.

15. The display device of claim 12, wherein the reflective layer does not overlap the second emission area and the non-emission area in a plan view.

16. A display device comprising:
a first display substrate including:
a first substrate;
a circuit element layer disposed on a surface of the first substrate; and
a light emitting element layer disposed on a surface of the circuit element layer; and
a second display substrate including:
a second substrate facing another surface of the first substrate; and
a lower wavelength control layer disposed on a surface of the second substrate facing the first substrate, wherein
the circuit element layer includes a lower metal layer including an opening overlapping a rear emission area in a plan view,
the light emitting element layer includes:
a first electrode and a second electrode disposed in each of the rear emission area and a front emission area, the first electrode and the second electrode being spaced apart from each other on the lower metal layer;
first light emitting elements disposed between the first electrode and the second electrode in the rear emission area;
second light emitting elements disposed between the first electrode and the second electrode in the front emission area; and
a reflective layer disposed on the first light emitting elements and overlapping the rear emission area in a plan view, and
the reflective layer overlaps at least one of the first light emitting elements in a plan view.

17. The display device of claim 16, wherein
the first display substrate includes an upper wavelength control layer and an upper light blocking member disposed on a surface of the light emitting element layer, and
the second display substrate includes a lower light blocking member disposed on a surface of the second substrate.

18. The display device of claim 17, wherein
the upper light blocking member overlaps the rear emission area and a non-emission area surrounding the rear emission area and the front emission area in a plan view,
the lower light blocking member overlaps the front emission area and the non-emission area in a plan view,
the upper wavelength control layer overlaps the front emission area in a plan view, and
the lower wavelength control layer overlaps the rear emission area in a plan view.

19. The display device of claim 16, wherein the opening of the lower metal layer overlaps the first light emitting elements in a plan view.

20. The display device of claim 16, wherein the reflective layer exposes the second light emitting elements.

* * * * *